United States Patent
Hakii et al.

(10) Patent No.: US 9,899,624 B2
(45) Date of Patent: Feb. 20, 2018

(54) TRANSPARENT CONDUCTOR AND ELECTRONIC DEVICE

(71) Applicant: Konica Minolta, Inc., Chiyoda-ku, Tokyo (JP)

(72) Inventors: Takeshi Hakii, Hachioji (JP); Toshiyuki Kinoshita, Tokyo (JP); Shigeru Kojima, Tokyo (JP); Kazuhiro Yoshida, Tokyo (JP)

(73) Assignee: KONICA MINOLTA, INC., Chiyoda-Ku, Tokyo (JP)

( * ) Notice: Subject to any disclaimer, the term of this patent is extended or adjusted under 35 U.S.C. 154(b) by 37 days.

(21) Appl. No.: 14/777,606

(22) PCT Filed: Mar. 18, 2014

(86) PCT No.: PCT/JP2014/057403
§ 371 (c)(1),
(2) Date: Sep. 16, 2015

(87) PCT Pub. No.: WO2014/148512
PCT Pub. Date: Sep. 25, 2014

(65) Prior Publication Data
US 2016/0293880 A1 Oct. 6, 2016

(30) Foreign Application Priority Data
Mar. 19, 2013 (JP) .................. 2013-057266

(51) Int. Cl.
*B32B 15/04* (2006.01)
*H01L 51/52* (2006.01)
*C22C 5/04* (2006.01)

(52) U.S. Cl.
CPC .......... *H01L 51/5215* (2013.01); *B32B 15/04* (2013.01); *C22C 5/04* (2013.01);
(Continued)

(58) Field of Classification Search
USPC ........ 428/688, 689, 697, 698, 699, 701, 702
See application file for complete search history.

(56) References Cited

U.S. PATENT DOCUMENTS

2009/0061190 A1* 3/2009 Gazit ................. C07K 5/06078
428/220

FOREIGN PATENT DOCUMENTS

| JP | H07105740 A | 4/1995 |
|----|----|----|
| JP | H0973001 A | 3/1997 |

(Continued)

OTHER PUBLICATIONS

Yoneyama (JP 2006184849) English machine translation.*
(Continued)

*Primary Examiner* — Lauren R Colgan
(74) *Attorney, Agent, or Firm* — Cantor Colburn LLP

(57) ABSTRACT

A transparent conductor which includes: a conductive layer that is formed of a metal material having a thickness of 15 nm or less and a platinum group element-containing layer including at least one of Pt and Pd, wherein, when an optical admittance at an interface on a side of the admittance-adjusting layer of the conductive layer at a wavelength of 570 nm is expressed as $Y_1=x_1+iy_1$ and an optical admittance at an interface on a side opposite to the admittance-adjusting layer of the conductive layer at a wavelength of 570 nm is expressed as $Y_2=x_2+iy_2$, at least one of $x_1$ and $x_2$ is 1.6 or more.

1 Claim, 3 Drawing Sheets

(52) U.S. Cl.
CPC ... *B32B 2307/202* (2013.01); *B32B 2307/412* (2013.01); *B32B 2457/00* (2013.01)

(56) References Cited

FOREIGN PATENT DOCUMENTS

| | | | |
|---|---|---|---|
| JP | 10270990 | A | 10/1998 |
| JP | H10264287 | A | 10/1998 |
| JP | H11174993 | A | 7/1999 |
| JP | 2001179868 | A | 7/2001 |
| JP | 2002015623 | A | 1/2002 |
| JP | 2002170429 | A | 6/2002 |
| JP | 2003121603 | A | 4/2003 |
| JP | 2004342375 | A | 12/2004 |
| JP | 2006164961 | A | 6/2006 |
| JP | 2006184849 | A | 7/2006 |
| JP | 2009151963 | A | 7/2009 |
| WO | 2014030324 | A1 | 2/2014 |
| WO | 2014064939 | A1 | 5/2014 |

OTHER PUBLICATIONS

International Search Report corresponding to Application No. PCT/JP2014/057403; dated Jun. 10, 2014, with English translation.
Notification of Reasons for Refusal for Corresponding JP Application No. 2015-506809; dated Aug. 8, 2017.
Notification for Submission of Examination Opinion for corresponding KR Application No. 10-2015-7025307; dated Nov. 17, 2017.

\* cited by examiner

TRANSPARENT CONDUCTOR AND ELECTRONIC DEVICE

This is the U.S. national stage of application No. PCT/JP2014/057403, filed on Mar. 18, 2014. Priority under 35 U.S.C. § 119(a) and 35 U.S.C. § 365(b) is claimed from Japanese Application No. 2013-057266, filed Mar. 19, 2013, the disclosure of which is also incorporated herein by reference.

TECHNICAL FIELD

The present invention relates to a transparent conductor, and an electronic device including the transparent conductor.

BACKGROUND ART

An organic electroluminescent element (hereinafter, referred to as "organic EL element") utilizing electroluminescence (hereinafter, referred to as "EL") of an organic material is a thin-film type completely-solid state element capable of emitting light at a low voltage of several volts to several ten volts, and has many excellent features such as high luminance, high light-emission efficiency, small thickness and light weight. Accordingly, in recent years, the element has attracted attention, as backlights for various kinds of displays, display boards such as a signboard and an emergency lamp, and surface emitting bodies such as illumination light sources.

Such an organic electroluminescent element has a configuration obtained by holding a light-emitting layer formed of an organic material between two electrodes, the emitted light generated in the light-emitting layer is extracted to the outside through the electrode. Therefore, at least one of the two electrodes is constituted as a transparent conductor.

As the transparent conductor, there have been examined a material of an oxide semiconductor type such as indium tin oxide (Indium Tin Oxide: ITO), and a material aiming at lowering electric resistance by laminating ITO and silver (e.g. refer to the following Patent Literatures 1, 2). However, ITO has a high material cost because of using a rare metal indium, and is required to be subjected to annealing treatment at about 300° C. after the formation in order to lower its electric resistance. Accordingly, there has been proposed a configuration in which an electrical conductivity is ensured even at a film thickness smaller than that of silver alone by blending aluminum with silver (e.g. refer to the following Patent Literature 3).

CITATION LIST

Patent Literature

PTL 1: Japanese Patent Laid-Open No. 2002-15623
PTL 2: Japanese Patent Laid-Open No. 2006-164961
PTL 3: Japanese Patent Laid-Open No. 2009-151963

SUMMARY OF INVENTION

Technical Problem

However, even by using the transparent conductor constituted using silver and aluminum, it has been difficult to attain sufficient electrical conductivity and light transmission property, at the same time.

Therefore, the present invention provides a transparent conductor having both electrical conductivity and light transmission property, and provides an electronic device in which the performance enhancement is achieved using the transparent conductor.

Solution to Problem

In the transparent conductor of the present invention, an admittance-adjusting layer and a conductive layer are laminated in this order. The conductive layer is formed of a metal material having a thickness of 15 nm or less and a platinum group element-containing layer including at least one of Pt and Pd. Furthermore, when an optical admittance at an interface on a side of the admittance-adjusting layer of the conductive layer at a wavelength of 570 nm is expressed as $Y_1 = x_1 + iy_1$ and an optical admittance at an interface on a side opposite to the admittance-adjusting layer of the conductive layer at a wavelength of 570 nm is expressed as $Y_2 = x_2 + iy_2$, at least one of $x_1$ and $x_2$ is 1.6 or more.

In addition, the electronic device of the present invention includes the above-described transparent conductor.

According to the transparent conductor of the present invention, since the transparent conductor has the conductive layer having the metal material formed adjacent to the platinum group element-containing layer, an interaction between the platinum group element and the metal material can be obtained to thereby give the conductive layer having a uniform thickness while being thin.

Furthermore, the light transmission property of the transparent conductor can be enhanced by adjusting the optical admittances of $Y_1$ and $Y_2$ of the conductive layer through the use of the admittance-adjusting layer.

Accordingly, in the transparent conductor, the enhancement of the conductivity and the enhancement of the light transmission property can be achieved at the same time. In addition, the electronic device excellent in conductivity and light transmission property can be configured by using the transparent conductor.

Advantageous Effects of Invention

According to the present invention, a transparent conductor and an electronic device, excellent in conductivity and light transmission property, can be provided.

DESCRIPTION OF EMBODIMENTS

Hereinafter, the best modes for carrying out the present invention will be explained, but the present invention is not limited to the following examples.

The explanation is done in the following order.
1. Transparent conductor (First emobdiment)
2. Transparent conductor (Second embodiment)
3. Organic electroluminescent element (Third embodiment)
4. Lighting device (Fourth embodiment)

1. Transparent Conductor (First Embodiment)

Figure 1:
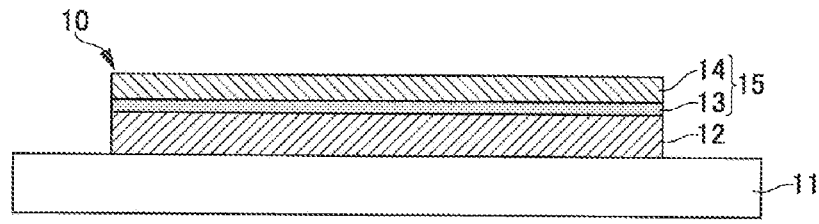
FIG. 1 is a drawing showing a schematic configuration of a transparent conductor of a first embodiment.

The first embodiment of the present invention will be explained. FIG. 1 shows a schematic configuration diagram (cross-sectional view) of the configuration of the transparent conductor of the first embodiment.

As shown in FIG. 1, the transparent conductor 10 includes an admittance-adjusting layer 12 and a conductive layer 15. The conductive layer 15 is composed of a metal material layer 14 and a platinum group element-containing layer 13 adjacent to the metal material layer 14. In addition, the platinum group element-containing layer 13 has a configuration of being sandwiched between the metal material layer 14 and the admittance-adjusting layer 12. Additionally, the transparent conductor 10 including: the admittance-adjusting layer 12; and the conductive layer 15 composed of the platinum group element-containing layer 13 and the metal material layer 14 is formed on the substrate 11.

Namely, the transparent conductor 10 has a configuration in which the admittance-adjusting layer 12, the platinum group element-containing layer 13, and the metal material layer 14 are laminated in this order on the substrate 11. In addition, in the conductive layer 15, the platinum group element-containing layer 13 is constituted to be sandwiched between the admittance-adjusting layer 12 and the metal material layer 14.

The transparent conductor 10 preferably has an average light absorption coefficient at a wavelength of 400 nm to 800 nm of 15% or less, and a maximum absorption coefficient of 25% or less.

The transparent conductor 10 has an average light absorption coefficient at a wavelength of 400 nm to 800 nm of 15% or less, preferably 12% or less, and further preferably 10% or less. In addition, the maximum absorption coefficient at a wavelength of 400 nm to 800 nm is 25% or less, preferably 20% or less, and further preferably 15% or less. The light absorption coefficient of the transparent conductor 10 can be reduced by suppressing a plasmon absorption coefficient of the conductive layer 15 and a light absorption coefficient of a material constituting each layer.

Furthermore, an average light transmissivity of the transparent conductor 10 at a wavelength of 450 nm to 800 nm is preferably 50% or more, more preferably 70% or more, and further preferably 80% or more. On the other hand, an average reflection coefficient of the transparent conductor 10 at a wavelength of 500 nm to 700 nm is preferably 20% or less, more preferably 15% or less, and further preferably 10% or less. When the average transmissivity at the above wavelength is 50% or more and the average reflection coefficient is 20% or less, the transparent conductor 10 can be applied to use application required for high transparency.

The above absorption coefficient, average transmissivity and average reflection coefficient are values measured by entering light for measurement to the transparent conductor from an angle inclined by 5 degrees relative to the front surface of the transparent conductor. The absorption coefficient, average transmissivity and average reflection coefficient are measured by a spectrophotometer.

Furthermore, the surface resistance of the transparent conductor 10 is preferably 30 Ω/sq. or less, more preferably 15 Ω/sq. or less. The value of the surface resistance of the transparent conductor 10 can be adjusted by a thickness of the conductive layer 15, or the like. The value of the surface resistance of the transparent conductor 10 can be measured in accordance with, for example, JIS K7194, ASTM D257, and the like. In addition, the value can be measure by a commercially available surface resistance measuring meter.

Hereinafter, as to the transparent conductor 10 of the present example, detailed explanations will be made in order of the substrate 11, the admittance-adjusting layer 12, the platinum group element-containing layer 13 and the conductive layer 15. In the transparent conductor 10 of the present example, the transparency means that the light transmissivity at a wavelength of 550 nm is 50% or more.

[Substrate 11]

The substrate 11 in which the transparent conductor 10 is formed is a supporting member on which various elements are formed. The substrate 11 preferably has a high transparency to the visual light, and examples of the substrate 11 can include a glass, a quartz, a transparent resin film, or the like, but is not limited thereto.

An average light transmissivity of the substrate 11 at a wavelength of 450 to 800 nm is preferably 70% or more, more preferably 80% or more, and further preferably 85% or more. When the average transmissivity of the substrate 11 is low, the average light transmissivity of the whole transparent conductor becomes lower. In addition, an average light absorption coefficient of the substrate 11 at a wavelength of 450 to 800 nm is preferably 10% or less, more preferably 5% or less, and further preferably 3% or less.

The average transmissivity of the substrate 11 is a value measured by entering light for measurement from an angle inclined by 5 degrees relative to the front surface of the substrate 11. On the other hand, the average light absorption coefficient is a value calculated according to the equation [average light absorbability=100−(average transmissivity+average light reflection coefficient)] by measuring the average light reflection coefficient of the substrate 11 in the same way as of the average transmissivity. The average transmissivity and average reflection coefficient are measured by a spectrophotometer.

A refractive index of the substrate 11 is preferably 1.40 to 1.95, more preferably 1.45 to 1.75, and further preferably 1.45 to 1.70. The refractive index of the substrate 11 is usually determined by the quality of material of the substrate 11. The refractive index of the substrate 11 is a refractive index of light of a wavelength of 510 nm, and is measured by an ellipsometer.

A thickness of the substrate 11 is preferably 1 μm to 20 mm, more preferably 10 μm to 2 mm. When the thickness of the substrate 11 is smaller than 1 μm, the strength of the substrate 11 becomes low, and there is a possibility of being broken at the time of forming the elements on the substrate 11. Furthermore, when the thickness of the substrate 11 is too large, there is a case of causing lowering of the flexibility and light transmissivity of the transparent conductor.

Examples of the glasses include silica glass, soda lime silica glass, lead glass, borosilicate glass, alkali-free glass, and the like. From the viewpoint of a close adhesive characteristic to the laminate structure of the transparent conductor 10, durability and smoothness, a physical treatment such as polishing may be given as necessary, or a film made of an inorganic material or an organic material, or a hybrid film obtained by combining these coating films may be formed on the surfaces of these glass materials.

Examples of the resin film include polyesters such as polyethylene terephthalate (PET) and polyethylene naphthalate (PEN), polyethylene, polypropylene, cellulose esters or derivative thereof such as cellophane, cellulose diacetate, cellulose triacetate (TAC), cellulose acetate butylate, cellulose acetate propionate (CAP), cellulose acetate phthalate and cellulose nitrate, polyvinylidene chloride, polyvinyl alcohol, polyethylene vinyl alcohol, syndiotactic polystyrene, polycarbonate, norbornen resin, polymethylpenten, polyether ketone, polyimide, polyether sulphone (PES), polyphenylene sulfide, polysluphones, polyether imide, polyether ketone imide, polyamide, fluororesin, nylon, polymethyl methacrylate, acryl or polyallylates, cycloolefin-based resins such as Alton (commercial name of JSR) or APEL (commercial name of Mitsui Chemicals), and the like.

A coating film made of inorganic materials or organic materials, or a hybrid coating film obtained by combining those coating films may be formed on the surface of the resin film. These coating films or hybrid coating films are preferably a barrier film (also referred to as barrier membrane, or the like) having a water vapor transmittance (25±0.5° C., relative humidity 90±2% RH) measured by the method in accordance with JIS-K-7129-1992 of 0.01 g/(m$^2$·24 hrs) or less. Furthermore, these films are preferably a high barrier film having an oxygen transmittance measured by the method in accordance with JIS-K-7126-1987 of $10^{-3}$ ml/(m$^2$·24 hr·atm) or less and a water vapor transmittance of $10^{-5}$ g/(m$^2$·24 hr) or less.

A material for forming the above barrier film may be a material having a function of suppressing penetration of substances such as water vapor and oxygen which deteriorate the resin film. For example, there can be used silicon oxide, silicon dioxide, silicon nitride, and the like. Furthermore, in order to improve fragility of the barrier film, it is more preferably to give a lamination structure of the inorganic layer and a layer of organic material (organic layer). The order of lamination of the inorganic layer and the organic layer is not particularly limited, and is preferable to alternately laminate both of the layers a plurality of times.

The method of forming the barrier film is not particularly limited, and there can be used, for example, vacuum deposition method, sputtering method, reactive sputtering method, molecular beam epitaxial method, cluster ion beam method, ion plating method, plasma polymerization method, atmospheric pressure plasma polymerization method, plasma CVD method, laser CVD method, thermal CVD method, coating method, and the like. Particularly preferable is the atmospheric pressure plasma polymerization method described in Japanese Patent Laid-Open No. 2004-68143.

[Admittance-Adjusting Layer]

The admittance-adjusting layer 12 is a layer provided in order to adjust optical properties of the transparent conductor 10 such as reflection coefficient and transmissivity, particularly reflection coefficient of the conductive layer 15. The admittance adjustment of the transparent conductor 10 by the admittance-adjusting layer 12 will be described later.

The admittance-adjusting layer 12 is preferably a layer containing a dielectric material or an oxide semiconductor material. The material constituting the admittance-adjusting layer 12 is preferably a metal oxide or a metal sulfide. Examples of the metal oxide or the metal sulfide include titanium oxide ($TiO_2$: n=2.1 to 2.4), indium tin oxide (ITO: n=1.9 to 2.2), zinc oxide (ZnO: n=1.9 to 2.0), zinc sulfide (ZnS: n=2.0 to 2.2), niobium oxide ($Nb_2O_5$: n=2.2 to 2.4), zirconium oxide ($ZrO_2$: n=2.0 to 2.1), cerium oxide ($CeO_2$: n=1.9 to 2.2), tantalum hexaoxide ($Ta_2O_5$: n=1.9 to 2.2), tin oxide ($SnO_2$: n=1.8 to 2.0), and the like, and from the viewpoint of refractive index and productivity, $TiO_2$ and $Nb_2O_5$ are preferable. The admittance-adjusting layer 12 may contain the dielectric material or the oxide semiconductor material alone, or may contain two or more kinds.

The admittance-adjusting layer 12 preferably has a refractive index higher than that of the layer in contact with the admittance-adjusting layer 12, on a side opposite to the side where the conductive layer 15 is provided. In the instant example, the admittance-adjusting layer 12 preferably has a refractive index than that of the substrate 11 where the transparent conductor 10 is provided.

In addition, a refractive index of the admittance-adjusting layer 12 is preferably 1.8 or more, more preferably 2.1 or more and 2.5 or less. As described below, when the refractive index of the admittance-adjusting layer 12 is higher than 1.8, the light transmission property of the transparent conductor 10 is easily increased. Furthermore, the refractive index of the admittance-adjusting layer 12 is preferably larger than the refractive index of the substrate 11 by 0.1 to 1.1 or more, more preferably by 0.4 to 1.0 or more. The refractive index of the admittance-adjusting layer 12 is a refractive index of light of a wavelength of 510 nm, and is measured by an ellipsometer. The refractive index of the admittance-adjusting layer 12 is adjusted by materials constituting the admittance-adjusting layer 12 and densities of the materials in the admittance-adjusting layer 12, and the like.

The thickness of the admittance-adjusting layer 12 is preferably 10 to 150 nm, more preferably 20 to 80 nm. When the thickness of the admittance-adjusting layer 12 is less than 10 nm, it is difficult to sufficiently enhance a light transmission property of the transparent conductor 10. On the other hand, when the thickness of the admittance-adjusting layer 12 exceeds 150 nm, the transparency (anti-reflection property) of the transparent conductor 10 is not increased. The thickness of the admittance-adjusting layer 12 is measured by an ellipsometer.

The admittance-adjusting layer 12 can be a layer formed by a general gas phase film forming method such as a vacuum vapor deposition method, a sputtering method, an ion plating method, a plasma CVD method or a thermal CVD method. From the viewpoint that the refractive index (density) of the admittance-adjusting layer 12 is increased, it is preferable to be a layer formed by an electron beam vapor deposition method or a sputtering method. In the case of the electron beam vapor deposition method, it is desirable to assist by IAD (ion assist) in order to enhance the film density.

[Conductive Layer]

The conductive layer 15 is constituted of the metal material layer 14 mainly constituting the conductive layer 15 and the platinum group element-containing layer 13 provided adjacent to the metal material layer 14.

The absorption of the conductive layer is determined by a total of two absorptions of an absorption inherent to the metal (hereinafter referred to as inherent absorption) and a plasmon absorption caused by mainly surface form of the conductive layer. When the conductive layer is thinner, the inherent absorption is small, and when the surface is smoother, the plasmon absorption is small, and thus it is effective that the conductive layer is as thin as possible and the surface is as smooth as possible, in order to make the absorption of the conductive layer small.

The plasmon absorption coefficient of the conductive layer 15 is preferably 20% or less over the whole range of the wavelength of 400 nm to 800 nm. Furthermore, the plasmon absorption coefficient of the conductive layer 15 is preferably 15% or less, more preferably 7% or less, and further preferably 5% or less. When the plasmon absorption coefficient in the above wavelength range is large, the light transmissivity of the conductive layer 15 becomes low. In addition, when there is a region where the plasmon absorption coefficient is large in a part of the wavelength of 400 nm to 800 nm, the transmitted light of the conductive layer 15 is easily colored.

[Platinum Group Element-Containing Layer]

The platinum group element-containing layer 13 is a layer which is provided adjacent to the metal material layer 14 and which contains at least one of platinum (Pt) and palladium (Pd). Furthermore, in the example, the platinum group element-containing layer 13 is a layer formed directly on the admittance-adjusting layer 12.

When forming the metal material layer 14 on the admittance-adjusting layer 12, a metal atom adhering to the admittance-adjusting layer 12 generates a mass (nuclear) having a certain size while diffusing on the surface. Then, the initial thin film formation proceeds so as to be along the periphery of the mass (nuclear). Accordingly, since there is a gap between the masses at the initial film of the formation, there is no electrical conduction between them. From the state, when the mass grows to have a thickness of approximately 15 μm, a part of the masses are connected with each other to thereby be slightly electrically conducted. However, since the surface of the film is not yet smooth, the plasmon absorption is easily generated.

In contrast to this, when forming a growing nuclear which contains at least one of platinum (Pt) and palladium (Pd) on the admittance-adjusting layer 12, the metal material constituting the metal material layer 14 becomes hard to move on the admittance-adjusting layer 12.

In addition, Pt and Pd can make the gap between the growth nuclei narrower than the gap between the masses which are formed by surface diffusion of the atom. Accordingly, when the film grows from the base point of the growth nuclei, the obtained film is easily thin and flat. Namely, even if the thickness is thin, the electric conduction can be obtained, and furthermore, the metal material layer 14 which is hard to generate the plasmon absorption can be formed.

The above growth nuclei are formed by a metal which is hard to diffuse on the surface of the admittance-adjusting layer 12. Examples of such a metal are the above-described platinum (Pt), palladium element (Pd), a material which contains at least one of Pt and Pd. Pt and Pd may be used alone, or in combination of two kinds. Furthermore, in addition to Pt and Pd, for example, there may be used gold, cobalt, nickel, molybdenum, titanium, aluminum, chromium, an alloy containing nickel and the like.

The platinum group element-containing layer 13 is required to be a layer that is hard to diffuse on the surface of the admittance-adjusting layer 12 and that has high affinity with the metal material constituting the metal material layer 14. Furthermore, it is preferable to give growth nuclei which are fine and dense. For example, the desired layer (growth nuclei) can be obtained by forming a growing layer while finely grinding the layer, by using an assist of IAD, and the like.

The average thickness of the layer (growth nuclei) constituting the platinum group element-containing layer 13 is preferably 3 nm or less, more preferably 0.1 nm or less, and further preferably a monoatomic layer. The average thickness of the layer (growth nuclei) may be regulated by a formation speed and a formation time.

In addition, the platinum group element-containing layer 13 may be a continuously homogeneous layer, may be a layer having non-continuous portions where the layer of the platinum group element is not formed and defects or pores are formed, or a layer of so-called island-shaped structure where the metal atoms attach to each other in a state of being separated and dispersed. The state where the metal atoms attach to each other by being separated is preferable.

Furthermore, the platinum group element-containing layer 13 may be formed as a single layer only by itself, or may be a mixed layer with the metal material of the metal material layer 14 which is formed on the platinum group element-containing layer 13.

In the platinum group element-containing layer 13, a layer (growing nuclear) containing Pt, Pd having a thickness of 3 nm or less can be formed by a sputtering method or a vapor deposition method. Alternately, the platinum group element-containing layer 13 can be formed by forming a layer containing Pt, Pd, dry-etching the layer to thereby cause a layer (growth nuclei) of platinum group element to remain.

There can be used, as the sputtering method, an ion beam sputtering method, a magnetron sputtering method, a reactive sputtering method, a bipolar sputtering method, a bias sputtering method, and the like. The sputtering time is optionally selected corresponding to the average thickness of the layer (growth nuclei) of the platinum group element thus formed and the formation speed. The sputtering formation speed is preferably 0.1 to 15 Å/sec, more preferably 0.1 to 7 Å/sec.

On the other hand, there can be used, as the vapor deposition methods, a vacuum vapor deposition method, an electron beam vapor deposition method, an ion plating method, an ion beam vapor deposition method, and the like. The time for the vapor deposition is optionally selected corresponding to the thus formed layer (growth nuclei) and the formation speed. The vapor deposition rate is preferably 0.1 to 15 Å/sec, more preferably 0.1 to 7 Å/sec.

In addition, in the case of dry-etching a layer to a desired thickness after forming the layer of the platinum group element on the admittance-adjusting layer 12, the method of forming the layer of the platinum group element is not particularly limited. There can be used, for example, a vapor-phase film formation method such as a vacuum vapor deposition method, a sputtering method, an ion plating method, a plasma CVD method or a thermal CVD method; or a wet film formation method such as a plating method. The average thickness of the layer of the platinum group element to be formed is preferably 3 to 15 nm, more preferably 5 to 10 nm. When the average thickness of the layer of the platinum group element is less than 3 nm, an amount of the metal is small, and there is a possibility that sufficient growth nuclei cannot be obtained.

The dry-etching method for the layer of the platinum group element means an etching method accompanied by a physical collision of an etching gas, an ion, a radical, or the like, and does not include a reactive gas etching in which etching is carried out by only a chemical reaction. The etching method accompanied by the physical collision is not particularly limited, and there can be used, for example, an ion beam etching, a reverse sputtering etching, a plasma etching, and the like. Particularly, the ion beam etching is preferable from the viewpoint that the desired unevenness can be easily formed on the thin film (growth nuclei) after the etching.

When the layer (growing nuclear) constituting the platinum group element-containing layer 13 is too thick, it is hard to obtain the thin and smooth metal material layer 14 even when forming the growth nuclei. Furthermore, the metal material layer 14 which is formed from the growth nuclei of the platinum group element-containing layer 13 becomes thick. The thickness of the growth nuclei of the platinum group element-containing layer 13 is calculated from the difference between the thickness of the layer of the platinum group element and the thickness by etching of the layer of the platinum group element. The thickness by the etching of the layer of the platinum group element is the product of the etching rate and the etching time. By etching, under the same condition, a layer of the platinum group element having a thickness of 50 nm separately produced on a glass substrate, the etching rate is calculated from the period of time when the light transmissivity after the etching is almost the same as that of the glass substrate (approximately, thickness of 0 nm). The average thickness of the growth nuclei of the platinum group element-containing layer 13 is adjusted by the period of time of the dry-etching.

[Metal Material Layer]

The metal material layer 14 is a layer constituted of a metal material that is formed adjacent to the platinum group element-containing layer 13.

The metal contained in the metal material layer 14 is not particularly limited, and there can be used, for example, silver, copper, gold, a platinum group, titanium, chromium, and the like. The metal material layer 14 may contain one kind of the metals, or may contain two or more kinds thereof.

The metal material layer 14 is preferably a layer constituted of silver or an alloy containing silver (Ag) as a main component, from the viewpoint of a low inherent absorption and a large electric conductivity. The alloy containing silver (Ag) as a main component which constitutes the metal material layer 14 is preferably an alloy containing silver in an amount of 50% by mass or more. Examples of the alloy containing silver as a main component include silver magnesium (AgMg), silver copper (AgCu), silver palladium (AgPd), silver copper palladium (AgPdCu), silver indium (AgIn), and the like.

The above metal material layer 14 may have a configuration in which layers of silver or an alloy containing silver as a main component are laminated by being divided to a plurality of layers.

Examples of the formation method of the metal material layer 14 include methods using: a wet process such as an application method, an ink-jet method, a coating method or a dipping method, and a dry process such as a vapor deposition method (resister heating, EB method or the like), a sputtering method or a CVD method, and the like. Among them, the vapor deposition method is preferably applied. Although the feature of the metal material layer 14 is to have a sufficient electrical conductivity without a high-temperature annealing treatment or the like after formation of the metal material layer on the platinum group element containing-layer layer 13, the high-temperature annealing treatment may be carried out after the formation.

The metal material layer 14 preferably has a film thickness within the range of 3 to 15 nm. When the film thickness is 15 nm or less, particularly 12 nm or less, it is preferable because an absorption component or a reflection component of the layer is suppressed at a low level and the light transmissivity of the transparent conductor is maintained. In addition, when the thickness of the metal material layer 14 is at least 3 nm or more, the electrical conductivity of the transparent conductor 10 is ensured.

In addition, in order to inhibit the light transmission property of the transparent conductor 10, it is preferable to set the thickness of the metal material layer 14 so that the total thickness of the metal material layer 14 and the platinum group element-containing layer 13 is 15 nm or less, and particularly, the total thickness is preferably 12 nm or less. When the total thickness of the metal material layer 14 and the platinum group element-containing layer 13 is 15 nm or less, it is preferable because an absorption component or a reflection component of the layer is suppressed at a low level and the light transmissivity of the transparent conductor 10 is maintained. Furthermore, when the total thickness of the metal material layer 14 and the platinum group element-containing layer 13 is 12 nm or less, the light transmission property of the transparent conductor 10 is further enhanced.

Note that the above-described conductive layer 15 constituted of the platinum group element-containing layer 13 and the metal material layer 14 provided adjacent to the platinum group element-containing layer 13 may be covered by a protective layer at the upper part of the metal material layer 14, or may be laminated by the other conductive layer. In this case, it is preferable that the protective layer and the conductive layer light have light transmission properties without impairing a light transmission property of the transparent conductor 10.

[As to Optical Admittance of Transparent Conductor]

Next, the optical admittance of the transparent conductor 10 will be explained. The admittance-adjusting layer 12 of the transparent conductor 10 has a function that adjusts the inherent absorption and reflection coefficient of the conductive layer 15.

Here, the reflection coefficient R of the surface of the transparent conductor 10 is determined by an optical admittance $y_0$ of the medium on which light is made incident and an equivalent admittance $Y_E$ of the surface of the transparent conductor 10, and the relation of these factors is represented by the following equation.

[Equation 1]

$$R = \left(\frac{y_0 - Y_E}{y_0 + Y_E}\right)^2$$

On the basis of the above equation, as the $|y_0-Y_E|$ is closer to 0, the reflection coefficient R becomes low. Here, for example, when the medium on which light is made incident is air, the optical admittance $y_0$ of air is 1, and thus, as the equivalent admittance $Y_E$ is closer to 1, the reflection coefficient R of the transparent conductor 10 becomes low.

Furthermore, as another example, when an organic EL layer is laminated on the transparent conductor 10, the optical admittance $y_0$ of the medium on which light is made incident is a value determined by the refractive index of the material constituting the organic EL layer. For example, when an organic material having a refractive index of 1.8 is laminated on the transparent conductor 10 as the organic EL layer, the optical admittance $y_0$ of the medium on which light is made incident becomes 1.8. Therefore, as the equivalent admittance $Y_E$ is closer to 1.8, the reflection coefficient R of the transparent conductor 10 becomes low.

The optical admittance Y is obtained from a ratio (H/E) of strength of an electric field and strength of magnetic field, and is usually the same as a refractive index. The equivalent admittance $Y_E$ is obtained from the optical admittance Y of each layer constituting the transparent conductor 10. For example, when the transparent conductor 10 is constituted of one layer, the equivalent admittance $Y_E$ of the transparent conductor 10 is equal to the optical admittance Y of the layer.

On the other hand, when the transparent conductor 10 is a laminated body, the optical admittance $Y_x(E_x\ H_x)$ of the laminated body constituted of the first layer to the $x_{th}$ layer is represented by a product of the optical admittance $Y_{x-1}$ ($E_{x-1}\ H_{x-1}$) of the laminated body constituted of the first layer to the $(x-1)_{th}$ layer and the specific matrix; and is obtained specifically by the following equation (1) or the equation (2).

In the case where the $x_{th}$ layer is constituted of a dielectric material or an oxide semiconductor material

[Equation 2]

$$\begin{pmatrix} E_x \\ H_x \end{pmatrix} = \begin{pmatrix} \cos\delta & \dfrac{i\sin\delta}{y} \\ iy\sin\delta & \cos\delta \end{pmatrix} \begin{pmatrix} E_{x-1} \\ H_{x-1} \end{pmatrix} \quad (1)$$

In the above equation, $\delta=2\pi nd/\lambda$, and y=n (admittance of the $x_{th}$ layer), and d is a thickness of the $m_{th}$ layer.

In the case where the $x_{th}$ layer is an ideal metal layer

[Equation 3]

$$\begin{pmatrix} E_x \\ H_x \end{pmatrix} = \begin{pmatrix} \cosh\gamma & \dfrac{i\sinh\gamma}{k} \\ -ik\sinh\gamma & \cosh\gamma \end{pmatrix} \begin{pmatrix} E_{x-1} \\ H_{x-1} \end{pmatrix} \quad (2)$$

In the above equation, $\gamma=2\pi kd/\lambda$, d is a thickness of the $x_{th}$ layer, and k is a refractive index (imaginary part) of the layer.

In addition, when the $x_{th}$ layer is the outermost layer, the optical admittance $Y_x(E_x\ H_x)$ of the laminated body of from the transparent supporting member to the outermost layer is the equivalent admittance $Y_E$ of the transparent conductor 10.

Figure 2:
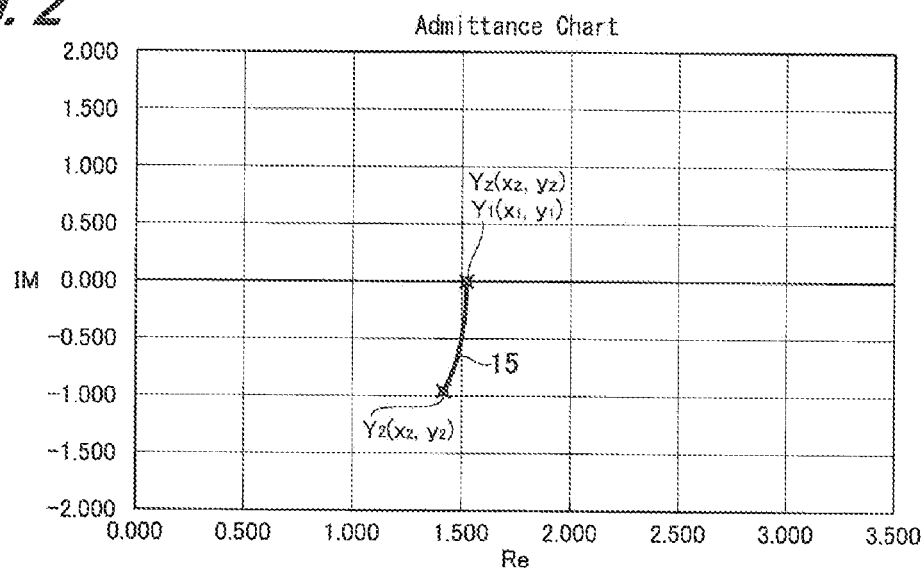
FIG. 2 is a drawing showing an admittance locus when a conductive layer is formed on a substrate.
Figure 3:
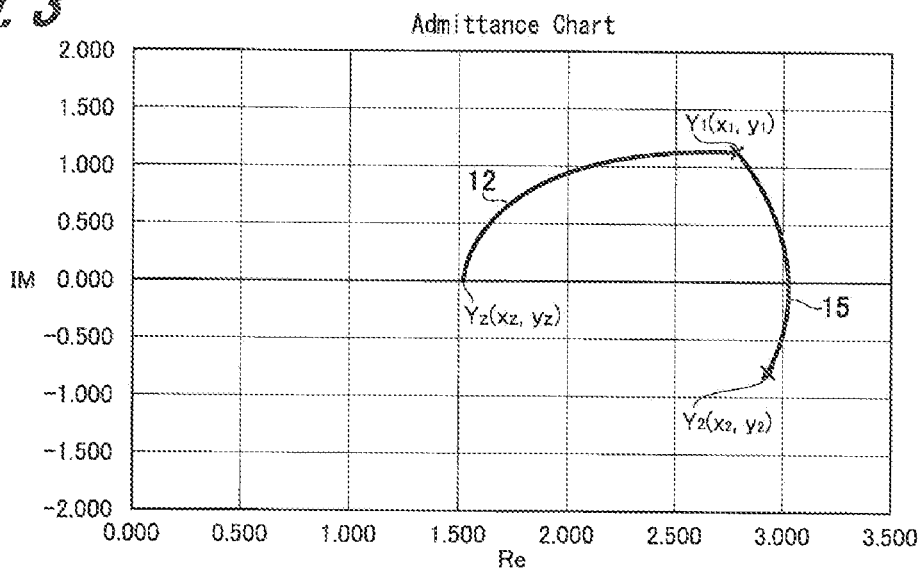
FIG. 3 is a drawing showing an admittance locus of the transparent conductor of the first embodiment.

Here, FIG. 2 shows the admittance locus at a wavelength of 570 nm when the conductive layer 15 is formed directly on the substrate 11. FIG. 3 shows the admittance locus at a wavelength of 570 nm when the conductive layer 15 is formed on the substrate 11 via the admittance-adjusting layer 12.

In FIG. 2, the optical admittance at a wavelength of 570 nm at the interface of the conductive layer 15 on the substrate 11 side is $Y_1=x_1+iy_1$. On the other hand, in FIG. 3, the optical admittance at a wavelength of 570 nm on the conductive layer 15 on the admittance-adjusting layer 12 side is $Y_1=x_1+iy_1$.

In addition, in FIGS. 2 and 3, the optical admittance at a wavelength of 570 nm at the interface of the conductive layer 15 on the side opposite to the above $Y_1$ is $Y_2=x_2+iy_2$. The $Y_2$ corresponds to the equivalent admittance $Y_E$ of the transparent conductor 10. Note that the interface on the side opposite to the above $Y_1$ means, in FIG. 2, the interface of the conductive layer 15 on the side opposite to the substrate 11, and in FIG. 3, the interface of the conductive layer 15 on the side opposite to the admittance-adjusting layer 12.

Furthermore, in the graph showing the admittance locus, the horizontal axis (Re) is a real part when the optical admittance Y is represented by [Y=x+iy], namely, x in the equation. In addition, the ordinate (IM) is an imaginary part of the optical admittance, namely, y in the equation.

In the admittance locus shown in FIG. 2, the coordinate of the starting point of the admittance locus is the equivalent admittance $Y_z$ of the substrate 11 on the conductive layer 15 side, and is the admittance coordinate $(x_z, y_z)$. The equivalent admittance $Y_2$ of the interface of the conductive layer 15 on the side opposite to the substrate 11 is the admittance coordinate $(x_2, y_2)$.

Since FIG. 2 shows the case where the conductive layer 15 is formed directly on the substrate, the admittance coordinate $(x_1, Y_1)$ of the equivalent admittance $Y_1$ of the conductive layer 15 on the substrate 11 side coincides with the $Y_z$ admittance coordinate $(x_z, y_z)$.

In addition, since the starting point of the admittance locus is on the surface of the substrate 11, the equivalent admittance $Y_1$ on the substrate 11 side depends on the refractive index of the substrate 11 (for example, n: 1.5), and the admittance coordinate of $Y_z$ and $Y_1$: $(x_z, y_z)=(x_1, y_1)=$ (1.5, 0) holds.

In the admittance locus shown in FIG. 3, the coordinate of the starting point of the admittance locus is the equivalent admittance $Y_z$ of the interface of the substrate 11 and the admittance-adjusting layer 12, and the admittance coordinate $(x_z, y_z)=(1.5, 0)$ holds.

In addition, the equivalent admittance $Y_1$ of the interface of the conductive layer 15 and the admittance-adjusting layer 12 is the admittance coordinate $(x_1, y_1)$. The equivalent admittance $Y_2$ of the interface of the conductive layer 15 on the side opposite to the admittance-adjusting layer 12 is the admittance coordinate $(x_2, y_2)$.

In FIGS. 2 and 3, the coordinate of the end point of the admittance locus is the equivalent admittance $Y_E$ of the transparent conductor 10. The distance between the admittance coordinate $(x_E, y_E)$ of the equivalent admittance $Y_E$ of the transparent conductor 10 and the admittance coordinate $(x_0, y_0)$ of the optical admittance $y_0$ of the medium to which a light enters is in proportion to the reflection coefficient R of the surface of the transparent conductor 10. Namely, as the coordinate $(x_E, y_E)$ of the equivalent admittance $Y_E$ and the admittance coordinate $(x_0, y_0)$ of the optical admittance $y_0$ of the medium on which light is made incident are closer to each other, the reflection coefficient R of the transparent conductor 10 becomes small.

As mentioned above, the equivalent admittance $Y_E$ of the transparent conductor 10 is equal to the equivalent admittance $Y_2$ of the interface of the conductive layer 15 on the side opposite to the admittance-adjusting layer 12. Accordingly, in the instant example, as the admittance coordinate $(x_2, y_2)$ of the equivalent admittance $Y_2$ of the conductive layer 15 and the admittance coordinate $(x_0, y_0)$ of the optical admittance $y_0$ of the medium on which light is made incident are closer to each other, the reflection coefficient R of the transparent conductor 10 becomes small.

For example, in the case where the medium on which light is made incident is air, due to the refractive index (n:1) of the air, the admittance coordinate $(x_0, y_0)$ of the optical admittance $y_0$ is equal to (1, 0). Furthermore, in the case of an organic layer such as an organic EL element, when the refractive index n of the organic layer is 1.8, the admittance coordinate $(x_0, y_0)$ of the optical admittance $y_0$ is equal to (1.8, 0).

Accordingly, as the admittance coordinate $(x_2, y_2)$ of the equivalent admittance $Y_2$ of the conductive layer 15 is closer to the admittance coordinate (1, 0) or (1.8, 0) of the optical admittance $y_0$, the reflection coefficient R of the transparent conductor 10 becomes small.

In addition, on the basis of a relational expression of the reflection coefficient R and the relational expression of the equivalent admittance $Y_E$ and the optical admittance $y_0$ of the medium on which light is made incident, when the coordinate $(x_E, y_E)$ of the equivalent admittance $Y_E$ is present on the right side of the admittance coordinate $(x_0, y_0)$ of the medium on which light is made incident, the reflection coefficient R tends to be small. Accordingly, the x coordinate $x_E$ of the equivalent admittance $Y_E$, namely, the x coordinate $x_2$ of the equivalent admittance $Y_2$ of the conductive layer 15 is preferably larger than the x coordinate $x_0$ of the optical admittance $y_0$ of the medium on which light is made incident.

According to the transparent conductor 10 of the present embodiment, the optical admittances of the both main surfaces of the conductive layer 15 at a wavelength of 570 nm are set to $Y_1$ and $Y_2$. In addition, when the optical admittance $Y_1=x_1+iy_1$, and the optical admittance $Y_2=x_2+iy_2$ holds, at least one of $x_1$ and $x_2$ is 1.6 or more. Furthermore, preferably, both of $x_1$ and $x_2$ are 1.6 or more. Namely, in the admittance locus of FIG. 3, the coordinate on the horizontal axis of at least one of $Y_1(x_1, y_1)$ and $Y_2(x_2, y_2)$ is 1.6 or more. The reason will be explained below.

Note that, in the case where the conductive layer 15 of the transparent conductor 10 is formed of a plurality of layers, the optical admittance of the interface of the layer of the conductive layer 15 which is closest to the admittance-adjusting layer 12 side is set to $Y_1=x_1+iy_1$. In addition, the optical admittance of the interface of the layer of the conductive layer 15 that is a layer on the most opposite side of the admittance-adjusting layer 12 is set to $Y_2=x_2+iy_2$.

Accordingly, in the case of the conductive layer 15 constituted of the metal material layer 14 and the platinum group element-containing layer 13, the optical admittance of the interface of the platinum group element-containing layer 13 on the admittance-adjusting layer 12 side is set to $Y_1=x_1+iy_1$. In addition, the optical admittance of the interface of the metal material layer 14 on the side opposite to the admittance-adjusting layer 12 is set to $Y_2=x_2+iy_2$.

The metal material constituting the conductive layer 15 has generally a large value of the imaginary part of the optical admittance, and when the metal material is laminated, the admittance locus sifts in the direction of the ordinary axis (imaginary part).

For example, when the conductive layer 15 is laminated directly on the substrate 11 without provision of the admittance-adjusting layer 12, as shown in FIG. 2, the admittance locus largely sifts from the admittance coordinate (1.5, 0) of the substrate 11 which is the starting point $(x_z, y_z)$ to the point $(x_2, y_2)$ in the direction of the ordinary axis (imaginary part). Namely, the absolute value of the imaginary part of the admittance coordinate becomes very large. In this way, when the absolute value of the imaginary part of the admittance coordinate becomes large, the optical admittance $Y_2$ of the conductive layer 15 (equivalent admittance $Y_E$ of the transparent conductor 10) sifts apart from the admittance coordinate $(x_0, y_0)$ of the optical admittance $y_0$ of the medium on which light is made incident. Therefore, it becomes difficult to bring the optical admittance $Y_2$ of the conductive layer 15 close to the optical admittance $y_0$ of the medium on which light is made incident, for example, close to the admittance coordinate (1, 0) of the air, or close to the admittance coordinate (1.8, 0) of the organic material.

In the case where the starting point $(x_z, y_z)$ of the admittance locus which is the admittance $Y_1$ of the interface of the conductive layer 15 on the substrate 11 side does not almost move from the admittance coordinate (1.5, 0) of the substrate 11, it is difficult that the admittance locus forms line symmetry about the horizontal axis in the graph. If the admittance locus does not form the line symmetry about the horizontal axis, the admittance locus is easily sifted at other wavelength (other than 570 nm), and the coordinate of the equivalent admittance $Y_E$ is difficult to be constant. Therefore, a wavelength range in which the effect of antireflection is not sufficient is easily generated.

In contrast to this, in the admittance locus of the transparent conductor 10 including the substrate 11 the admittance-adjusting layer 12/the conductive layer 15 in this order as shown in FIG. 3 at a wavelength of 570 nm, the admittance coordinate $(x_1, y_1)$ of the admittance $Y_1$ of the conductive layer 15 sifts largely in the positive directions of the horizontal axis (real part) and the vertical axis (imaginary part), from the starting point of the admittance locus $(x_A, y_A)$, by the admittance-adjusting layer 12.

Particularly, when the coordinate $x_1$ of the real part of $Y_1$ is 1.6 or more, the arch of the admittance locus becomes large, and then the admittance coordinate $(x_1, y_1)$ of the admittance $Y_1$ of the conductive layer 15 sifts largely from the starting point $(x_z, y_z)$ of the admittance locus to the positive direction of the imaginary part.

Namely, even if the admittance locus sifts largely in the negative direction of the imaginary part by the conductive layer 15, the absolute value |y2β of the imaginary part of $Y_2$ is hard to be large. Furthermore, the admittance locus of the conductive layer 15 easily becomes line-symmetrical about the horizontal axis of the graph. Therefore, in the other wavelength (other than 570 nm), the admittance locus easily becomes line-symmetrical about the horizontal axis of the graph, and the coordinate of the equivalent admittance $Y_E$ of each wavelength becomes almost the same. Namely, in each wavelength, the value of the equivalent admittance $Y_E$ becomes easily close to the admittance coordinate $(x_0, y_0)$ of the optical admittance $y_0$ of the medium on which light is made incident. This shows that sufficient effect of antireflection can be obtained in any wavelength.

When the metal material is used for the conductive layer 15, it is considered that the light absorption generated in the conductive layer 15 has two origins. One is the absorption inherent to the metal material, and the other is the plasmon absorption caused by the structure of the conductive layer 15. The absorption inherent to the metal material can be minimized by maintaining the admittance of the conductive layer 15 at a high level.

Here, the following relational expression can be established between the admittance Y of the interface of each layer and the strength E of the electric field present in each layer.

[Equation 4]

$$E \propto \frac{1}{\sqrt{\text{Re}(Y)}}$$

On the basis of the above relational expression, when the admittance Y becomes large, the strength E of the electric field becomes small, and thus the loss of the electric filed (light absorption) is suppressed. Accordingly, when the coordinate $x_1$ of the real part of the admittance $Y_1$ of the conductive layer 15 is adjusted so as to be 1.6 or more by the admittance-adjusting layer 12, the admittance $Y_1$ of the conductive layer 15 becomes large and the light absorption by the conductive layer 15 is decreased.

In addition, when the coordinate $x_2$ of the real part of the admittance $Y_2$ of the conductive layer 15 is adjusted so as to be 1.6 or more by the admittance-adjusting layer 12, the admittance $Y_2$ of the conductive layer 15 becomes large and the light absorption by the conductive layer 15 is decreased. Furthermore, since the admittance locus of the conductive layer 15 easily becomes line-symmetrical about the horizontal axis of the graph and the electric field of the conductive layer 15 becomes small, the light absorption by the conductive layer 15 is suppressed.

As mentioned above, at least one of $x_1$ and $x_2$ is preferably 1.6 or more and 7.0 or less. More preferably, $x_1$ and $x_2$ are both 1.6 or more and 7.0 or less. Further preferably, $x_1$ and/or $x_2$ are 1.8 or more and 5.5 or less, and further more preferably 2.0 or more and 3.0 or less.

Furthermore, among $x_1$ and $x_2$, particularly $x_1$ is preferably 1.6 or more. $x_1$ is adjusted by the refractive index of the admittance-adjusting layer 12 and the thickness of the admittance-adjusting layer 12, and the like. In this case, $x_2$ is preferably 1.3 or more and 5.5 or less, more preferably 1.5 or more and 3.5 or less.

$x_2$ is adjusted by the refractive index of the conductive layer 15 and the thickness of the conductive layer 15, and the like.

Here, the absolute value of the difference of $x_1$ and $x_2 |x_1-x_2|$ is preferably 1.5 or less, more preferably 1.0 or less, and further preferably 0.8 or less. In addition, particularly, when the coordinate Y cross ($x_{cross}$, 0) which is a cross point of the admittance locus of the conductive layer 15 and the horizontal axis, the value of $|x_1-x_2|/x_{cross}$ is preferably smaller than 0.5, more preferably 0.3 or less, and further preferably 0.2 or less.

Furthermore, in order to make the admittance locus line-symmetrical about the horizontal axis of the graph, the coordinate $y_1$ of the imaginary part of the above $Y_1$ and the coordinate $y_2$ of the imaginary part of the above $Y_2$ preferably satisfy $y_1 \times y_2 < 0$.

Moreover, the distance $(|x_E-x_0|+|y_E-y_0|)$ between the coordinate $(x_E, y_E)$ of the equivalent admittance $Y_E$ and the admittance coordinate $(x_0, y_0)$ of the optical admittance $y_0$ of the medium on which light is made incident is preferably 0.9 or less, more preferably 0.6 or less, and further preferably 0.3 or less.

[Effects of Transparent Conductor]

The transparent conductor 10 constituted as described above has a configuration in which a conductive layer 15 obtained by forming the metal material layer 14 adjacent to the platinum group element-containing layer 13 is provided. Thereby, when forming the metal material layer 14 adjacent to the platinum group element-containing layer 13, the metal atom constituting the metal material layer 14 interacts with Pt or Pd constituting the platinum group element-containing layer 13 to thereby reduce a diffusion distance of the metal atom on the surface of the platinum group element-containing layer 13, which causes suppression of aggregation of silver. Accordingly, generally, the metal material layer 14 that tends to be easily isolated in an island shape as the result of the growth by a nuclear growth-type (Volumer-Weber: VW type) is formed by the growth of a single layer growth type (Frank-van der Merwe: FM type). Therefore, a conductive layer 15 having a uniform thickness can be obtained even though the layer is thin.

In addition, in the transparent conductor 10, the real part $x_1$ of the optical admittance $Y_1$ of the interface of the conductive layer 15 and the real part $x_2$ of the optical admittance $Y_2$ are adjusted to be 1.6 or more by the admittance-adjusting layer 12. By adjusting the admittance of the interface of the conductive layer 15 by the admittance-adjusting layer 12, the reflection of the transparent conductor 10 can be suppressed and the light transmission property can be enhanced.

As a result, the transparent conductor 10 ensuring the conductivity while ensuring the light transmission property can be obtained. Therefore, in the transparent conductor 10, it becomes possible to achieve the enhancement of the conductivity and the enhancement of the transmissivity at the same time.

2. Transparent Conductor (Second Embodiment)

Figure 4:
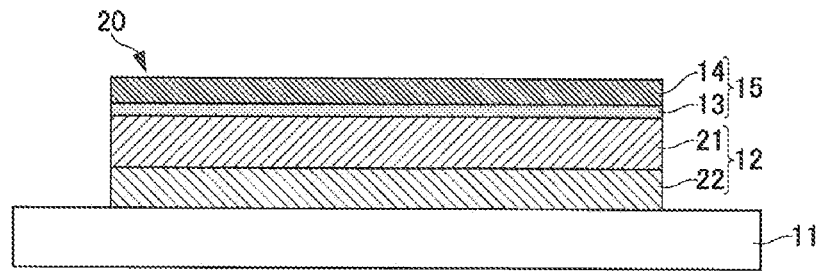
FIG. 4 is a drawing showing a schematic configuration of the transparent conductor of a second embodiment.

Next, the second embodiment of the present invention will be explained. FIG. 4 shows a schematic configuration diagram (cross-sectional view) of the transparent conductor of the second embodiment. As shown in FIG. 4, the transparent conductor 20 of the second embodiment is different from the transparent conductor 10 of the first embodiment shown in FIG. 1 only in that the admittance-adjusting layer 12 has the first admittance-adjusting layer 21 and the second admittance-adjusting layer 22. Hereinafter, overlapping detailed explanation as to the same elements as the first embodiment will be omitted, and the configuration of the transparent conductor 20 of the second embodiment will be explained in the following.

As shown in FIG. 4, the transparent conductor 20 includes the first admittance-adjusting layer 21 and the second admittance-adjusting layer 22 as the admittance-adjusting layer 12, and further includes the conductive layer 15.

The conductive layer 15 is constituted of the metal material layer 14 and the platinum group element-containing layer 13 formed at a portion adjacent to the metal material layer 14. Namely, in the conductive layer 15, the platinum group element-containing layer 13 is constituted to be sandwiched between the metal material layer 14 and the admittance-adjusting layer 12. In addition, the transparent conductor 20 constituted of the second admittance-adjusting layer 22, the first admittance-adjusting layer 21, the platinum group element-containing layer 13 and the conductive layer 15 is formed on the substrate 11.

Namely, the transparent conductor 20 is constituted by laminating the second admittance-adjusting layer 22, the first admittance-adjusting layer 21, the platinum group element-containing layer 13 and the metal material layer 14 on the substrate 11 in this order, and the platinum group element-containing layer 13 is constituted to be sandwiched between the first admittance-adjusting layer 21 and the metal material layer 14.

In the transparent conductor 20 of the second embodiment, the platinum group element-containing layer 13 and the metal material layer 14 constituting the conductive layer 15 have the same configuration as those in the first embodiment. In addition, the first admittance-adjusting layer 21 can be the same configuration as the admittance-adjusting layer of the transparent conductor of the first embodiment. Therefore, the detailed explanation as to the configurations of the first admittance-adjusting layer 21, and the conductive layer 15, the platinum group element-containing layer 13 and the metal material layer 14 which are formed on the first admittance-adjusting layer 21 will be omitted.

[Second Admittance-Adjusting Layer]

The second admittance-adjusting layer 22 is a layer provided on the side where the conductive layer 15 is not formed among the two layers constituting the admittance-adjusting layer 12. Namely, in the admittance-adjusting layer 12, the first admittance-adjusting layer 21 is provided on the side where the conductive layer 15 is formed, and the second admittance-adjusting layer 22 is provided on the side opposite to the side where the conductive layer 15 is provided.

The second admittance-adjusting layer 22 is a layer having a refractive index lower than the first admittance-adjusting layer 21. Particularly, the second admittance-adjusting layer 22 preferably has a refractive index lower than the first admittance-adjusting layer 21 by 0.2 or more at a wavelength of 550 nm. The second admittance-adjusting layer 22 is constituted of a material having a low refractive index and a light transmission property. For example, there can be used a low refractive index material generally used for an optical film such as magnesium fluoride (MgF$_2$: n=1.37), lithium fluoride (LiF: n=1.39), Calcium fluoride (CaF$_2$: n=1.43), or aluminum fluoride (AlF$_3$: n=1.38); a polymeric material such as Poly(1,1,1,3,3,3-hexafluoroisopropyl acrylate); n=1.38, Poly(2,2,3,3,4,4,4-heptafluorobutyl acrylate); n=1.38, Poly(2,2,3,3,4,4,4-heptafluorobutyl methacrylate); n=1.38, Poly(2,2,3,3,3-pentafluoropropyl acrylate); n=1.39, Poly(1,1,1,3,3,3-hexafluoroisopropyl methacrylate); n=1.39, Poly(2,2,3,4,4,4-hexafluorobutyl acrylate); n=1.39, Poly(2,2,3,3,3-pentafluoropropyl methacrylate); n=1.40, Poly(2,2,2-trifluoroethyl acrylate); n=1.41, Poly(2,2,3,3-tetrafluoropropyl acrylate); n=1.42, Poly(2,2,3,3-tetrafluoropropyl methacrylate); n=1.42, or Poly(2,2,2-trifluoroethyl methacrylate); n=1.42; and the like.

The thickness of the second admittance-adjusting layer 22 is preferably 40 to 200 nm, more preferably 50 to 180 nm. When the thickness of the admittance-adjusting layer 12 is less than 40 nm or more than 200 nm, it is difficult to sufficiently enhance a light transmission property of the transparent conductor 20. The thickness of the admittance-adjusting layer 12 is measured by an ellipsometer.

[With Respect to Optical Admittance of Transparent Conductor 10]

Figure 5:
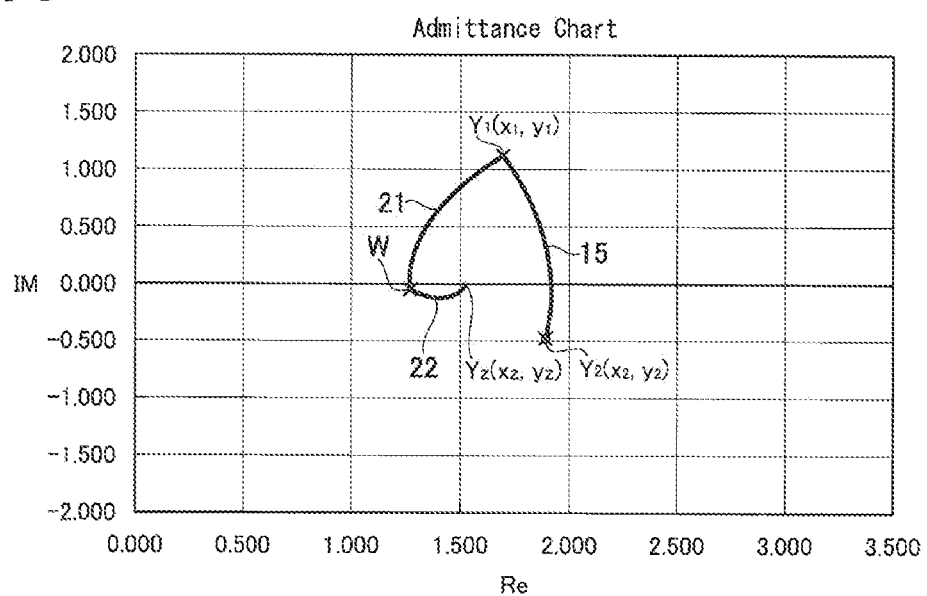
FIG. 5 is a drawing showing an admittance locus of the transparent conductor of the second embodiment.

Next, the optical admittance of the transparent conductor 20 will be explained. FIG. 5 shows the admittance locus of the transparent conductor 20 at a wavelength of 570 nm.

The optical admittance of the interface of the conductive layer 15 on the first admittance-adjusting layer 21 side at a wavelength of 570 nm is set to $Y_1 = x_1 + iy_1$, and the optical admittance of the interface of the conductive layer 15 on the side opposite to the first admittance-adjusting layer 21 at a wavelength of 570 nm is set to $Y_2 = x_2 + iy_2$.

The admittance coordinate $(x_2, y_2)$ of the optical admittance $Y_2$ of the conductive layer 15 corresponds to the equivalent admittance $Y_E$ of the transparent conductor 20.

In the admittance locus shown in FIG. 5, the coordinate of the starting point of the admittance locus is the equivalent admittance $Y_z$ of the substrate 11 on the conductive layer 15 side, and is the admittance coordinate $(x_z, y_z)$.

In the transparent conductor 20, the admittance locus sifts from the admittance coordinate $(x_z, y_z)$ to the point W in the negative direction of the horizontal axis (real part), by including the second admittance-adjusting layer 22 having a lower refractive index than that of the first admittance-adjusting layer 21. The sifted point W corresponds to the optical admittance of the interface between the first admittance-adjusting layer 21 and the second admittance-adjusting layer 22.

Furthermore, as shown in FIG. 5, by providing the first admittance-adjusting layer 21, it is possible to adjust the admittance locus of the transparent conductor 20 so that the coordinate $x_1$ of the real part of $Y_1$ closes to 1.6 or more. In addition, the admittance locus of the conductive layer 15 can be closes to the line symmetrical along the horizontal axis of the graph.

The action to the transparent conductor 20 by the first admittance-adjusting layer 21 is the same as the action of the admittance-adjusting layer to the transparent conductor explained in the first embodiment.

As described above, the admittance locus sifts in the negative direction along the horizontal axis (imaginary part) by providing with the second admittance-adjusting layer 22 having a lower refractive index. Sifting in the negative direction is carried out. Therefore, in comparison with the above case of the first embodiment in which the second admittance-adjusting layer 22 is not provided, the admittance coordinate $(x_1, y_1)$ of the optical admittance $Y_1$ and the admittance coordinate $(x_2, y_2)$ of the optical admittance $Y_2$ of the conductive layer 15 which are in the positive direction sift in the negative direction together.

As a result, it is possible to bring the optical admittance $Y_2$ of the conductive layer 15 close to the optical admittance $y_0$ of the medium to which a light enters, for example, to the admittance coordinate (1, 0) of the air, or close to the admittance coordinate (1.8, 0) of the organic material.

Accordingly, the value of the equivalent admittance $Y_E$ easily becomes close to the admittance coordinate $(x_0, y_0)$ of the optical admittance $y_0$ of the medium on which light is made incident, with the result that the refractive index of the transparent conductor 20 can be decreased and the light transmission property can be enhanced. In addition, the absorption inherent to the metal material can be minimized by maintaining the admittance of the conductive layer 15 at a high level.

As described above, in the case where the admittance-adjusting layer 12 is formed by a plurality of layers, design freedom can be improved by optionally combining the materials and the thicknesses of the layers constituting the admittance-adjusting layer 12. Therefore, in comparison with the case where the admittance-adjusting layer is formed by one layer, the optical admittances $Y_1$ and $Y_2$ of the conductive layer 15 can be easily adjusted, and the range in which the optical admittances $Y_1$ and $Y_2$ are optimized can be enlarged.

Accordingly, when the admittance-adjusting layer 12 is configures by a plurality of the layers such as the first admittance-adjusting layer 21 and the second admittance-adjusting layer 22, the light transmission property of the transparent conductor can be enhanced.

3. Organic Electroluminescent Element (First Embodiment: Bottom Emission Type)

Figure 6:
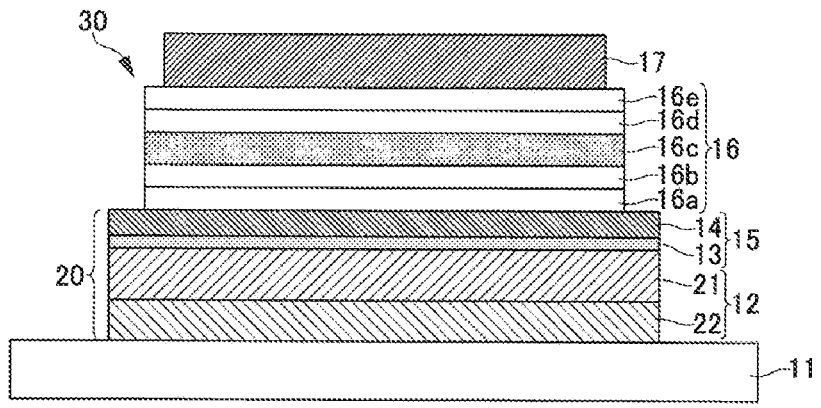
FIG. 6 is a drawing showing a schematic configuration of an organic electroluminescent element of a third embodiment.

Next, the third embodiment of the present invention will be explained. In the third embodiment, as one example of electronic devices, there will be explained an organic electroluminescent element of the bottom emission type using the transparent conductor of the above second embodiment. FIG. 6 shows a cross-sectional configuration diagram of the organic electroluminescent element of the present embodiment. Hereinafter, on the basis of this drawing, the configuration of the organic electroluminescent element will be explained.

[Configuration of Organic Electroluminescent Element]

The organic electroluminescent element 30 shown in FIG. 6 is provided on a substrate 11 of a substrate, from the substrate 11 side, and there are laminated the transparent conductor 20 serving as an anode, the light-emitting functional layer 16 and the counter electrode 17 serving as a cathode in this order. In the configuration, the transparent conductor 20 of the above-described first embodiment is used as the transparent conductor 20. Accordingly, the organic electroluminescent element 30 is configured as the bottom emission type in which a generated light (hereinafter referred to as emitted light h) is extracted at least from the side of the substrate 11.

The whole layer structure of the organic electroluminescent element 30 is not limited to the above, and may be a general layer structure. Here, the transparent conductor 20 is disposed at the side of anode (i.e. positive electrode) and the metal material layer 14 of the conductive layer 15 functions as the anode, whereas the counter electrode 17 functions as the cathode (i.e. negative electrode).

In the case, for example, the light-emitting functional layer 16 has an exemplified configuration in which [positive hole injection layer 16a/positive hole transport layer 16b/light-emitting layer 16c/electron transport layer 16d/electron injection layer 16e] are laminated in this order on the upper side of the transparent conductor 20 of the anode, and among them, the light-emitting functional layer 16 has at least a light-emitting layer 16c constituted using an organic material. The positive hole injection layer 16a and the positive hole transport layer 16b may be provided as a positive transport-injection layer which has positive hole transport property and positive hole injection property. The electron transport layer 16d and the electron injection layer 16e may be provided as one layer which has electron transport property and electron injection property. Among the light-emitting functional layer 16, for example, the electron injection layer 16e may be constituted by an inorganic material.

In the light-emitting functional layer 16, if necessary, other layers such as a positive hole blocking layer and an electron blocking layer may be laminated on a necessary portion. Furthermore, the light-emitting layer 16c may have light-emitting layers of each color corresponding to the respective range of wavelength, and the light-emitting layers may be laminated via an intermediate layer having non-light-emitting property to form a light-emitting layer unit. The intermediate layer may function as the positive hole blocking layer, the electron blocking layer. Further, the counter electrode 17 which is cathode may have a laminated structure if necessary. In these constructions, only the portion where the light-emitting functional layer 16 is sandwiched between the transparent conductor 20 and the counter electrode 17 acts the light-emitting region in the organic electroluminescent element 30.

In the above layer configuration, in order to reduce electric resistance of the transparent conductor 20, an auxiliary electrode may be provided in contact with the conductive layer 15 of the transparent conductor 20.

Hereinafter, the details of the main layers for constituting the above organic electroluminescent element 30 will be explained in the order of the substrate 11, the transparent conductor 20, the counter electrode 17, the light-emitting layer 16c of the light-emitting functional layer 16, other layers of the light-emitting functional layer 16, the auxiliary electrode, and the transparent sealing material. After that, production method of the organic electroluminescent element 30 will be explained.

[Substrate]

The substrate 11 is formed by using a transparent material having a light transmission property among the substrates where the transparent conductor 20 of the first embodiment shown in the above FIG. 1 is provided.

[Transparent Conductor (Anode Side)]

The transparent conductor 20 is the transparent conductor 20 of the above-described embodiment, and has the configuration in which the second admittance-adjusting layer 22, the first admittance-adjusting layer 21, the platinum group element-containing layer 13 and the conductive layer 15 are formed from the substrate 11 side in this order.

Particularly, here, the conductive layer 15 constituting the transparent conductor 20 serves as substantially an anode.

[Counter Electrode (Cathode)]

The counter electrode 17 is a conductive layer having a function as a cathode for supplying an electron to the light-emitting functional layer 16, and a metal, an alloy, an organic or inorganic conductive compound, and a mixture thereof are used. Specific examples include gold, aluminum, silver, magnesium, lithium, a mixture of magnesium/copper, a mixture of magnesium/silver, a mixture of magnesium/aluminum, a mixture of magnesium/indium, indium, a mixture of lithium/aluminum, a rare-earth metal, an oxide semiconductor such as ITO, ZnO, $TiO_2$ or $SnO_2$, and the like.

The counter electrode 17 can be produced by forming a thin film from the conductive material through the use of a method such as vapor deposition or sputtering. In addition, the sheet resistance as the counter electrode 17 is preferably several hundreds of $\Omega$/sq. or less. The thickness is generally selected within the range of 5 nm to 5 $\mu$m, preferably within the range of 5 nm to 200 nm.

[Light-Emitting Layer]

The light-emitting layer 16c used for the organic electroluminescent element of the present embodiment contains a phosphorescence-emitting compound as a light-emitting material.

The light-emitting layer 16c of the present invention is a layer which emits light through recombination of electrons injected from an electrode or an electron transport layer 16d and positive holes injected from the positive hole transport layer 16b. A portion that emits light may be either the inside of the light-emitting layer 16c or an interface between the light-emitting layer 16c and its adjacent layer.

The configuration of the light-emitting layer 16c is not particularly limited as long as the light-emitting material contained therein satisfies a light emission requirement. In addition, there may be a plurality of light-emitting layers having the same emission spectrum and/or emission maximum wavelength. In the case, it is preferable that non-luminescent intermediate layers (not shown) are present between the light-emitting layers 16c.

The total thickness of the light-emitting layers 16c is preferably within a range of 1 to 100 nm and, more preferably within a range of 1 to 30 nm from the viewpoint of obtaining a lower driving voltage. Note that the total thickness of the light-emitting layers 16c means a thickness including the thickness of the intermediate layers when the non-luminescent intermediate layers are present between the light-emitting layers 16c.

In the case of the light-emitting layer 16c constituted by lamination of a plurality of layers, it is preferable to adjust the thickness of individual light-emitting layer to be within a range of 1 to 50 nm and it is more preferable to adjust the thickness thereof to be within a range of 1 to 20 nm. When the plurality of the laminated light-emitting layers corresponds to the emitted color of blue, green and red, respectively, the relationship between the respective thickness of the light-emitting layers of blue, green and red is not particularly limited.

The above light-emitting layer 16c can be formed through the film-formation of a light-emitting material and a host compound, which are described below, by a well-known thin film forming method such as a vacuum vapor deposition method, a spin coating method, a casting method, an LB method or an ink-jet method.

In addition, in the light-emitting layer 16c, a plurality of light-emitting materials may be mixed. Furthermore, a fluorescence-emitting material and a fluorescence-emitting material (also referred to as fluorescence-emitting dopant, fluorescence-emitting compound) may be mixed in the same light-emitting layer 16c.

It is preferable that the light-emitting layer 16c is constituted so as to contain a host compound (also referred to as emitting host) and a light-emitting material (also referred to as light-emitting dopant compound, a guest compound), and emit light through the light-emitting material.

(Host Compound)

The host compound contained in the light-emitting layer 16c is preferably a compound having a phosphorescence quantum yield in phosphorescence emission of less than 0.1 at room temperature (25° C.). Furthermore, the host compound more preferably has a phosphorescent quantum yield of less than 0.01. In addition, a volume ratio in the layer of 50% or more is preferable among the compounds contained in the light-emitting layer 16c.

A well-known host compound may be used as the host compound, alone or in combination of a plurality of kinds. The use of a plurality of host compounds makes it possible to adjust transfer of charges, and to increase an efficiency of the organic electroluminescent element 30. In addition, the use of a plurality of light-emitting materials described below makes it possible to mix different colors of light to be emitted, and to thereby produce any luminous color.

The host compound to be used may be a well-known low molecular weight compound, a high molecular compound having a repeating unit or a low-molecular-weight compound having a polymerizable group such as a vinyl group or an epoxy group (vapor deposition-polymerizable light emission host) may be used.

The well-known host compound is preferably a compound preventing a light emission wavelength from becoming longer and having a high Tg (glass transition temperature) while having a positive hole transport ability and an electron transport ability. The glass transition point (Tg) herein is a value measured using DSC (Differential Scanning Colorimetry) in accordance with JIS-K-7121.

Examples of the host compound which is applicable to the organic electroluminescent element include the compounds H1 to H79 described in Paragraphs [0163] to [0178] of Japanese Patent Laid-Open No. 2013-4245. The compounds H1 to H79 described in Paragraphs [0163] to [0178] of Japanese Patent Laid-Open No. 2013-4245 are incorporated into the present description.

Specific examples of other well-known host compound are compounds described in the following documents; for example, Japanese Patent Laid-Open Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084, 2002-308837, and the like.

(Light-Emitting Material)

The light-emitting material that can be used for the organic electroluminescent element of the present embodiment includes a phosphorescence-emitting material (also referred to as a phosphorescent compound or a phosphorescence-emitting compound).

The phosphorescence-emitting material is defined as a compound in which light emission from an excited triplet state is observed, and specifically, a compound which emits phosphorescence at room temperature (25° C.) and a phosphorescence quantum yield at 25° C. is 0.01 or more, and preferable phosphorescence quantum yield is 0.1 or more.

The phosphorescence quantum yield can be measured by a method described on page 398 of Bunko II of Dai 4 Han Jikken Kagaku Koza 7 (Spectroscopy II of Lecture of Experimental Chemistry vol. 7, 4th edition) (1992, published by Maruzen Co., Ltd.). The phosphorescence quantum yield in a solution can be measured by using various solvents, and in the present example, when the phosphorescence-emitting material is used, it is only necessary to achieve the above-described phosphorescence quantum yield (0.01 or more) in any of appropriate solvents.

There are two kinds of principles regarding light emission of the phosphorescence-emitting material. One is an energy transfer type, in which carriers recombine on a host compound transferring the carriers to theeby produce an excited state of the host compound, the energy is transferred to a phosphorescence-emitting material, and then light emission from the phosphorescence-emitting material is carried out. The other is a carrier trap type, in which a phosphorescence-emitting material serves as a carrier trap, carriers recombine on the phosphorescence-emitting material, and then light emission from the phosphorescence-emitting material is carried out. In either case, the excited state energy of the phosphorescence-emitting material is required to be lower than that of the host compound.

The phosphorescence-emitting material can be suitably selected from the well-known phosphorescence-emitting compounds used for light-emitting layers 16c of general organic electroluminescent elements, preferably a complex compound containing metal of the groups 8 to 10 in the element periodic table. More preferably, the phosphorescence-emitting material is an iridium compound, an osmium compound, a platinum compound (a platinum complex compound) or a rare earth complex, and most preferably, is an iridium compound.

In the organic electroluminescent element 30 of the present embodiment, at least one light-emitting layer 16c may contain two or more types of light-emitting materials, and a ratio of concentration of the phosphorescence-emitting material in the light-emitting layer 16c may vary in the direction of thickness of the light-emitting layer 16c.

An amount of the phosphorescence-emitting material is preferably 0.1% by volume or more and less than 30% by volume relative to the total volume of the light-emitting layer 16c.

Examples of the phosphorescence emitting compound which is applicable to the organic electroluminescent element include preferably the compounds represented by the general formula (4), the general formula (5), the general formula (6) and the exemplified compounds described in Paragraphs [0185] to [0235] of Japanese Patent Laid-Open No. 2013-4245. Furthermore, as other exemplified compounds, the following Ir-46, Ir-47, Ir-48 are shown. The compounds represented by the general formula (4), the general formula (5), the general formula (6) and the exemplified compounds (Pt-1 to Pt-3, Os-1, Ir-1 to Ir-45) described in Paragraphs [0185] to [02351] of Japanese Patent Laid-Open No. 2013-4245 are incorporated into the present description.

[Chem. 1]

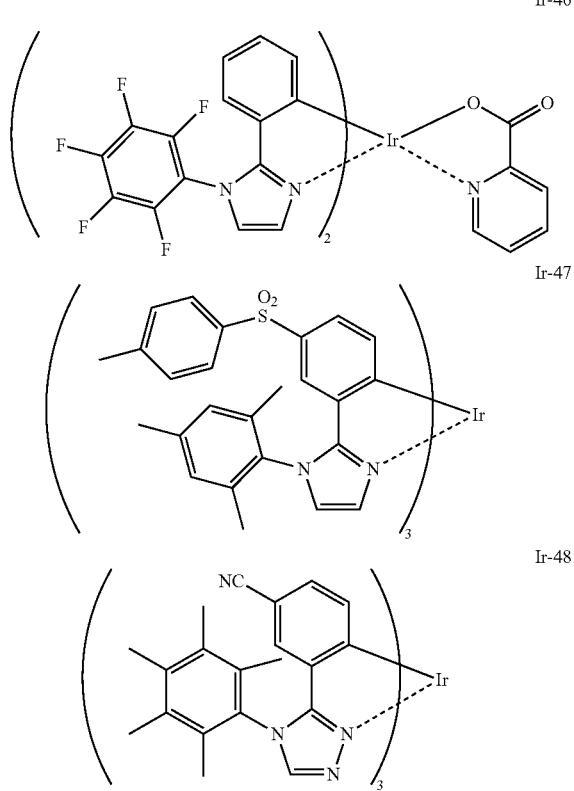

The above-described phosphorescence-emitting compounds (also referred to as phosphorescence-emitting metal complexes and the like) can be synthesized by employing methods described in documents such as Organic Letters, vol. 3, No. 16, pp. 2579-2581 (2001); Inorganic Chemistry, vol. 30, No. 8, pp. 1685-1687 (1991); J. Am. Chem. Soc., vol. 123, p. 4304 (2001); Inorganic Chemistry, vol. 40, No. 7, pp. 1704-1711 (2001); Inorganic Chemistry, vol. 41, No. 12, pp. 3055-3066 (2002); New Journal of Chemistry, vol. 26, p. 1171 (2002); and European Journal of Organic Chemistry, vol. 4, pp. 695-709 (2004); and reference documents described in these documents.

(Fluorescence-Emitting Material)

Examples of the fluorescence-emitting material include a coumarin-based dye, a pyran-based dye, a cyanine-based dye, a croconium-based dye, a squarylium-based dye, an oxobenzanthracene-based dye, a fluorescein-based dye, a rhodamine-based dye, a pyrylium-based dye, a perylene-based dye, a stilbene-based dye, a polythiophene-based dye, a rare earth complex-based fluorescent material, or the like.

[Injection Layer: Positive Hole Injection Layer, Electron Injection Layer]

The injection layer is a layer disposed between an electrode and the light-emitting layer 16c to decrease a driving voltage and to improve luminance of light emitted, which is detailed in Part 2, Chapter 2 "Denkyoku Zairyo" (pp. 123-166) of "Yuki EL Soshi To Sono Kogyoka Saizensen (Nov. 30, 1998, published by N. T. S Co., Ltd.)", and examples thereof include a positive hole injection layer 16a and an electron injection layer 16e.

The injection layer is provided as necessary. The positive hole injection layer 16a may be disposed between an anode and the light-emitting layer 16c or the positive hole transport layer 16b, and the electron injection layer 16e may be disposed between a cathode and the light-emitting layer 16c or the electron transport layer 16d.

The positive hole injection layer 16a is also detailed in documents such as Japanese Patent Laid-Open Nos. 09-45479, 09-260062 and 08-288069, and examples include a phthalocyanine layer represented by copper phthalocyanine, an oxide layer represented by vanadium oxide, an amorphous carbon layer, a polymer layer employing a conductive polymer such as polyaniline (emeraldine) or polythiophene, and the like.

The electron injection layer 16e is also detailed in documents such as Japanese Patent Laid-Ope Nos. 06-325871, 09-17574 and 10-74586 and examples include: a metal layer represented by strontium or aluminum, an alkali metal halide layer represented by potassium fluoride, an alkali earth metal compound layer represented by magnesium fluoride, an oxide layer represented by molybdenum oxide, and the like. It is preferable that the electron injection layer 16e is a very thin film, and the thickness thereof is within a range of 1 nm to 10 μm although it depends on the material thereof.

[Positive Hole Transport Layer]

The positive hole transport layer 16b is formed of a positive hole transport material having a function of transporting positive holes, and a positive hole injection layer 16a and an electron blocking layer are also included in the positive hole transport layer 16b in the broad sense of the word. The positive hole transport layer 16b can be provided as a sole layer or as a plurality of layers.

The positive hole transport material is a material having an injection capability or transport capability of positive holes, and barrier property against electrons and either an organic substance or an inorganic substance may be used. Examples include a triazole derivative, an oxadiazole derivative, an imidazole derivative, a polyarylalkane derivative, a pyrazoline derivative and a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline-based copolymer, and a conductive high-molecular oligomer, particularly, a thiophene oligomer and the like. Those described above can be used as the positive hole transport material. However, it is preferable to use a porphyrin compound, an aromatic tertiary amine compound and a styrylamine compound, particularly, an aromatic tertiary amine compound.

Typical examples of the aromatic tertiary amine compound and the styrylamine compound include N,N,N',N'-tetraphenyl-4,4'-diaminophenyl; N,N'-diphenyl-N, N'-bis(3-methylphenyl)-[1,1'-biphenyl]-4,4'-diamine (TPD); 2,2-bis(4-di-p-tolylaminophenyl)propane; 1,1-bis(4-di-p-tolylaminophenyl)cyclohexane; N,N,N',N'-tetra-p-tolyl-4,4'-diaminobiphenyl; 1,1-bis(4-di-p-tolylaminophenyl)-4-phenylcyclohexane; bis(4-dimethylamino-2-metylphenyl)phenylmethane; bis(4-di-p-tolylaminophenyl)phenylmethane; N,N'-diphenyl-N, N'-di(4-methoxyphenyl)-4,4'-diaminobiphenyl; N,N,N',N'-tetraphenyl-4,4'-diaminodiphenylether; 4,4'-bis(diphenylamino)quadriphenyl; N,N,N-tri(p-tolyl)amine; 4-(di-p-tolylamino)-4'-[4-(di-p-tolylamino)styryl]stilbene; 4-N, N-diphenylamino-(2-diphenylvinyl)benzene; 3-methoxy-4'-N,N-di-phenylaminostilbene; N-phenylcarbazole; those having two condensed aromatic rings in a molecule described in U.S. Pat. No. 5,061,569, for instance, 4,4'-bis[N-(1-naphthyl)-N- phenylamino]biphenyl (NPD), 4,4',4"-tris[N-(3-methylphenyl)-N-phenylamind triphenylamine (MTDATA) in which three triphenylamine units are bonded in a star burst form described in Japanese Patent Laid-Open No. 04-308688 and the like.

Furthermore, polymer materials in which these materials are introduced into a polymer chain or constitute a main chain of a polymer can also be used. Moreover, inorganic compounds such as a p type-Si and a p type-SiC can also be used as the positive hole injection material and the positive hole transport material.

In addition, it is also possible to use so-called p type positive hole transport materials described in documents such as Japanese Patent Laid-Open No. 11-251067 and Applied Physics Letters 80 (2002), p. 139 by J. Huang et. al. It is preferable to use these materials from the viewpoint of obtaining a light-emitting element having high efficiency.

The positive hole transport layer 16b can be formed by making the above-described positive hole transport material a thin film by a well-known method such as the vacuum vapor deposition method, the spin coating method, the casting method, the printing method including the ink-jet method or the LB method. The thickness of the positive hole transport layer 16b is not particularly limited, but the thickness is generally within a range about of 5 to 5 µm, preferably within a range of 5 nm to 200 nm. The positive hole transport layer 16b may have a single layer configuration constituted of one or two or more of the above-described materials.

Furthermore, it is possible to enhance the p property by doping the material of the positive hole transport layer 16b with impurities. Examples include those described in documents such as Japanese Patent Laid-Open Nos. 04-297076, 2000-196140, 2001-102175 and J. Appl. Phys., 95, 5773 (2004).

As described above, it is preferable that enhancement of a high p property of the positive hole transport layer 16b makes it possible to produce an element which consumes lower electric power.

[Electron Transport Layer]

The electron transport layer 16d is formed of a material having a function of transporting electrons, and, in a broad sense, the electron injection layer 16e and a positive hole blocking layer (not shown) are included in the electron transport layer 16d. The electron transport layer 16d can be provided as a single layer or a laminated layer of a plurality of layers.

In the electron transport layer 16d having a single layer configuration and the electron transport layer 16d having a laminated layer configuration, the electron transport material constituting a layer provided adjacent to the light-emitting layer 16c has a function of transporting electrons injected from the cathode to the light-emitting layer 16c. The material to be used can be optionally selected from well-known compounds. Examples include a nitro-substituted fluorene derivative, a diphenylquinone derivative, a thiopyrandioxide derivative, carbodiimide, a fluorenylidenemethane derivative, anthraquinonedimethane, an anthrone derivative, and an oxadiazole derivative and the like. Furthermore, in the above-described oxadiazole derivative, a thiadiazole derivative which is formed by substituting the oxygen atom of the above oxadiazole ring by a sulfur atom, and a quinoxaline derivative having a quinoxaline ring which is well-known as an electron withdrawing group can be used as the material of the electron transport layer 16d. Moreover, polymer materials in which these materials are introduced into a polymer chain or constitute a main chain of a polymer can also be used.

Furthermore, metal complexes of an 8-quinolinol derivative such as: tris(8-quinolinol)aluminum (Alq3), tris(5, 7-dichloro-8-quinolinol) aluminum, tris(5, 7-dibromo-8-quinolinol) aluminum, tris(2-methyl-8-quinolinol)aluminum, tris(5-methyl-8-quinolinol)aluminum and bis (8-quinolinol) zinc (Znq), and metal complexes in which the central metal of these metal complexes is substituted by In, Mg, Cu, Ca, Sn, Ga or Pb can also be used as the material of the electron transport layer 16d.

Besides, a metal-free or metalphthalocyanine and those in which the terminals thereof are substituted by an alkyl group, a sulfonic acid group or the like can be preferably used as the material of the electron transport layer 16d. Moreover, the distyrylpyrazine derivative mentioned as an example of the material of the light-emitting layer 16c can also be used as the material of the electron transport layer 16d. In the same way as the positive hole injection layer 16a and the positive hole transport layer 16b, inorganic semiconductors such as an n type-Si and an n type-SiC can also be used as the material of the electron transport layer 16d.

The electron transport layer 16d can be formed by thinning the above-described electron transport material by a well-known method such as the vacuum vapor deposition method, the spin coating method, the casting method, the printing method including the ink-jet method or the LB method. The thickness of the electron transport layer 16d is not particularly limited, but the thickness is generally within a range of 5 nm to 5 µm, preferably within a range of 5 to 200 nm. The electron transport layer 16d may have a single layer configuration constituted of one or two or more of the above-described materials.

Furthermore, it is possible to enhance the n property by doping the material of the electron transport layer 16d with impurities. Examples thereof include those described in documents such as Japanese Patent Laid-Open Nos. 04-297076, 10-270172, 2000-196140 and 2001-102175 and J. Appl. Phys., 95, 5773 (2004). Moreover, it is preferable to introduce potassium or a potassium compound into the electron transport layer 16d. Examples of the potassium compound that can be used include potassium fluoride, and the like. As described above, an element which consumes lower electric power can be produced by enhancement of an n property of the electron transport layer 16d.

In addition, there can be preferably used the compounds represented by the general formula (1), the general formula (2), and the general formula (3) described in Paragraphs [0057] to [0148] of Japanese Patent Laid-Open No. 2013-4245, as the material (compound having electron transporting property) of the electron transport layer 16d; and the exemplified compounds 1 to 111 can be used. Furthermore, the compound 112 to 134 are shown in the following, as the other exemplified compounds. The compounds represented by the general formula (1), the general formula (2), and the general formula (3), described in Paragraphs [0057] to [0148] of Japanese Patent Laid-Open No. 2013-4245 are incorporated into the present description.

[Chem. 2]
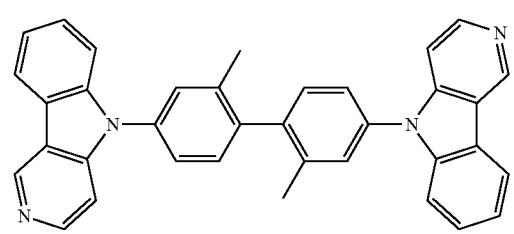
112
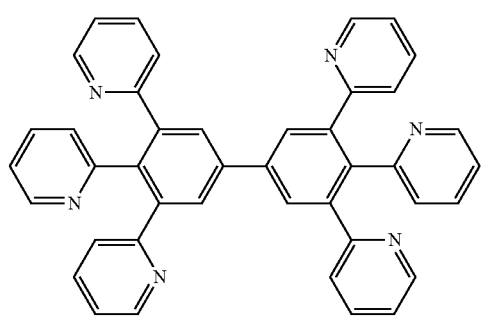
113
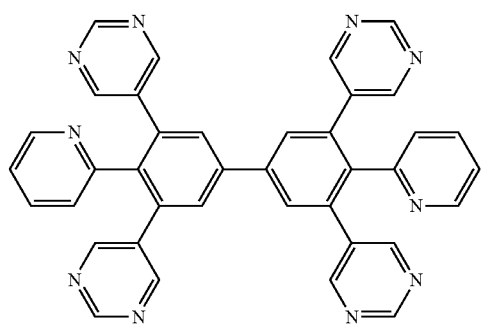
114
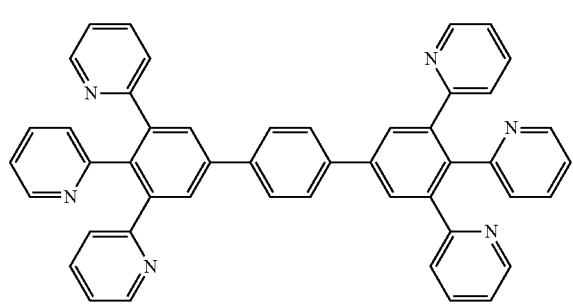
115
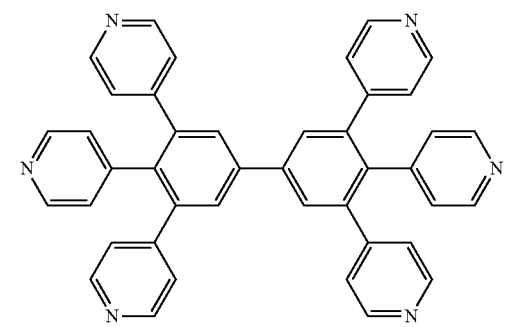
116
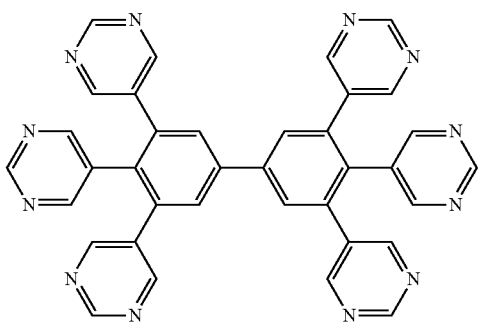
117
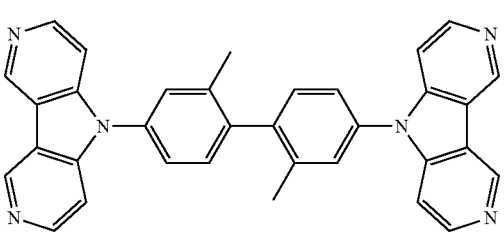
118
[Chem. 3]
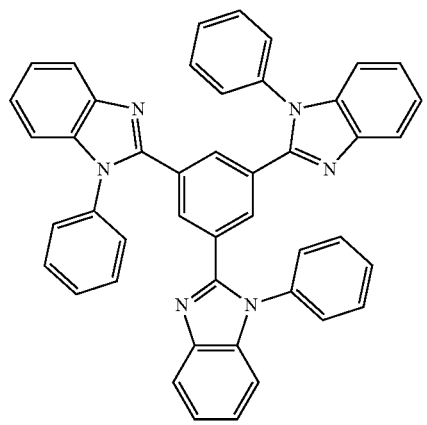
119
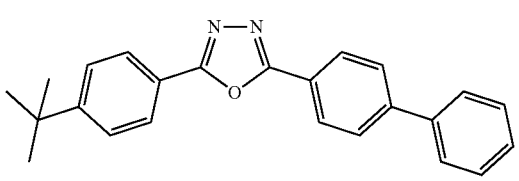
120
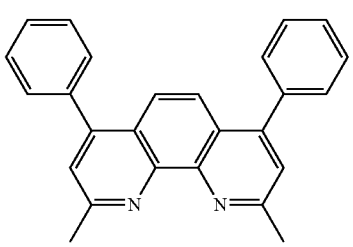
121

[Chem. 4]
122
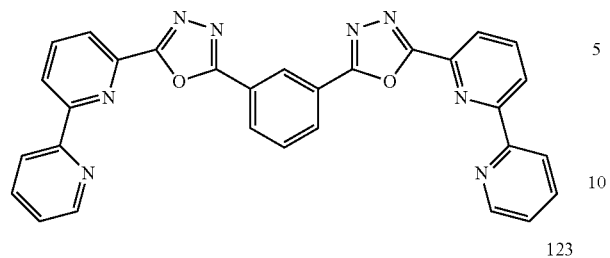
123
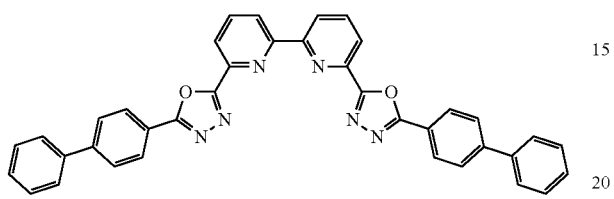
124
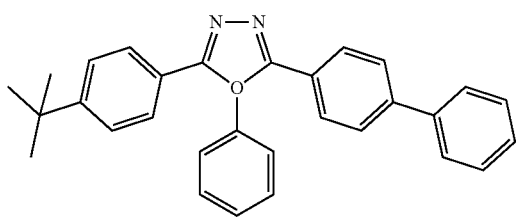
125
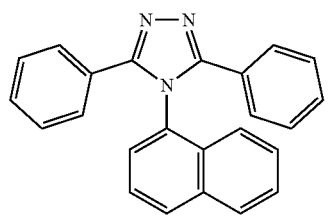
126
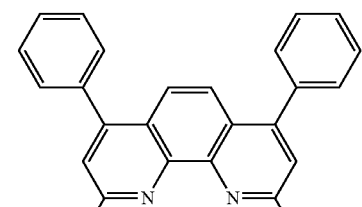
127
128
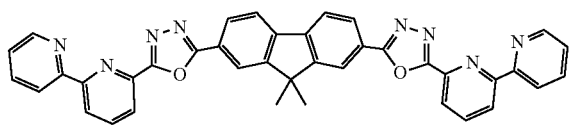
129
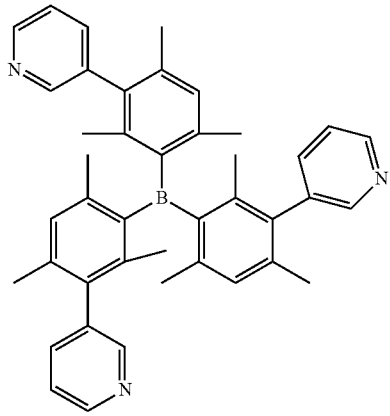
130
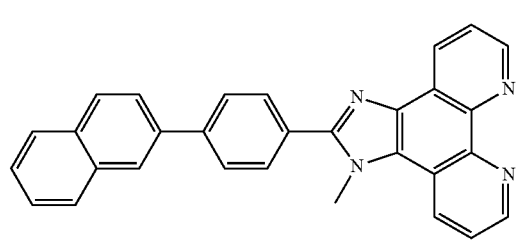
131
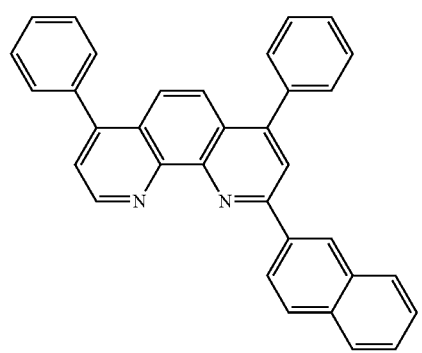
132
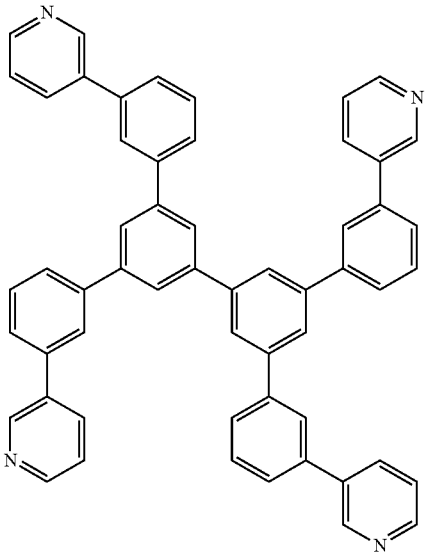

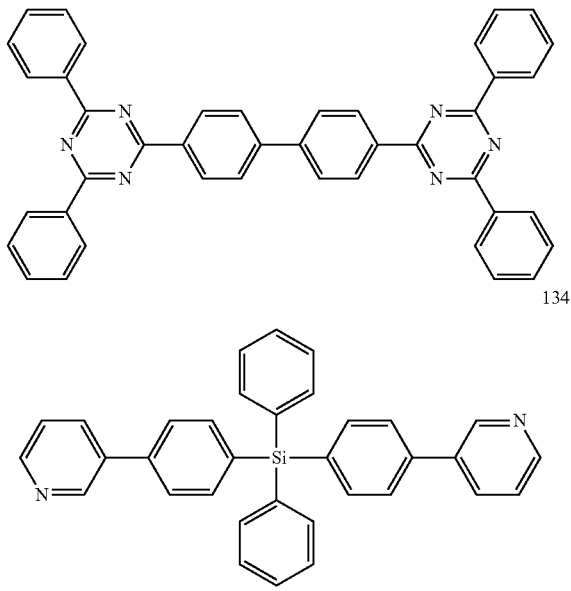

133

134

[Blocking Layer: Positive Hole Bblocking Layer, Electron Blocking Layer]

The blocking layer is provided as necessary in addition to the basic constituent layers of thin organic compound films described above. Examples thereof include a positive hole blocking layer described in documents such as Japanese Patent Laid-Open Nos. 11-204258, 11-204359, and p. 237 of "Yuki EL Soshi To Sono Kogyoka Saizensen (Organic EL Element and Front of Industrialization thereof) (Nov. 30, 1998, published by N. T. S Co., Ltd.)", and the like.

The positive hole blocking layer has a function of the electron transport layer 16d in a broad sense. The positive hole blocking layer is formed of a positive hole blocking material having a remarkably small capability to transport positive holes while having a function of transporting electrons and can increase recombination probability of electrons and positive holes by blocking positive holes while transporting electrons. Furthermore, as necessary, the configuration of an electron transport layer 16d described below can be used as the positive hole blocking layer according to the present invention. It is preferable that the positive hole blocking layer is provided adjacent to the light-emitting layer 16c.

On the other hand, the electron blocking layer has a function as the positive hole transport layer 16b in a broad sense. The electron blocking layer is formed of a material having a very little capability to transport electrons while having a function of transporting positive holes, and can increase the recombination probability of electrons and positive holes by blocking electrons while transporting positive holes. Furthermore, as necessary, the configuration of a positive hole transport layer 16b described below can be applied to the electron blocking layer. The thickness of the positive hole blocking layer according to the present invention is preferably 3 to 100 nm, more preferably 5 to 30 nm.

[Auxiliary Electrode]

An auxiliary electrode is provided in order to lower an electric resistance of the transparent conductor 20 and is provided in contact with the conductive layer 15 of the transparent conductor 20. As a material forming the auxiliary electrode, a metal having a low electric resistance such as gold, platinum, silver, copper or aluminum is preferable. These metals may be patterned within a range not affecting the extraction of the emitted light h from a light extraction surface due to the low light transmission property. Examples of a method for forming the auxiliary electrode include the vapor deposition method, the sputtering method, the printing method, the ink-jet method, an aerosol jet method and the like. It is preferable that the line width of the auxiliary electrode is 50 μm or less in view of an aperture ratio for the light extraction, and the thickness of the auxiliary electrode is 1 μm or more in view of electric conductivity.

[Sealing Material]

A sealing material is a material for covering the organic electroluminescent element 30, and may be a plate-like (film-like) sealing member which is fixed to a substrate 11 side by an adhesive, or may be a sealing membrane. The sealing material is provided in a state where the terminal portions of transparent conductor 20 and the counter electrode 17 of the organic electroluminescent element 30 are exposed and at least the light-emitting functional layer 16 is covered. Alternatively, the transparent sealing material may be constituted so that an electrode is provided on the sealing material, and the electrode is electrically conducted with the terminal portions of transparent conductor 20 and the counter electrode 17 of the organic electroluminescent element 30.

Specific examples of the plate-like (film-like) transparent sealing material include a glass substrate, a polymer substrate, and the transparent sealing material may be used by making these substrates into thinner-type films. Examples of glass substrate can include particularly soda lime glass, barium strontium-containing glass, lead glass, alminosilicate glass, borosilicate glass, barium borosilicate glass, quartz and the like. In addition, examples of the polymer substrate can include polycarbonate, acryl, polyethylene terephthalate, polyethersulfide, polysulfone and the like.

Among them, from the viewpoint of thinning the element, the polymer substrate in the form of a thin film is preferably used as the sealing material.

Furthermore, the polymer substrate in the form of a thin film preferably has an oxygen transmittance measured in accordance with the method of JIS-K-7126-1987 of $1 \times 10^{-3}$ ml/(m$^2 \cdot$24 h·atm) or less and a water vapor transmittance (25±0.5° C., relative humidity (90±2)% RH) measured in accordance with the method of JIS-K-7129-1992 of $1 \times 10^{-3}$ g/(m$^2 \cdot$24 h) or less.

Moreover, the above substrate material may also be processed into the form of a recessed plate to thereby be used as the sealing material. In this case, processing such as sandblast processing or chemical etching processing is performed on the substrate member to thereby form recessed portions.

Not to limit to these, a metallic material may be used. Examples of the metallic material include one or more of kinds selected from the group consisting of stainless steel, iron, copper, aluminum, magnesium, nickel, zinc, chromium, titanium, molybdenum, silicon, germanium and tantalum or an alloy thereof. Since the metallic material is made thin film to be used as the sealing material, the whole of the light-emitting panel where the organic electroluminescent element is provided can be made thinner.

In addition, the adhesive for fixing the plate-like transparent sealing material to the substrate 11 side is also used as a sealant for sealing the organic electroluminescent element 30 sandwiched between the sealing material and the substrate 11. Examples of the adhesive can include a photo curable and thermosetting-type adhesive such as an acrylic acid-based oligomer or methacrylic acid-based oligomer having a reactive vinyl group, a moisture curable type adhesive such as 2-cyanoacrylic acid ester and the like.

Furthermore, examples of the adhesive can include a thermosetting or chemical curable (two liquids mixing type) adhesive such as epoxy-based adhesive. In addition, there can be included a hot-melt type adhesive such as polyamide, polyester, polyolefin, or the like. Additionally, there can be included an ultraviolet curable-type epoxy resin adhesive of cationic curable-type.

Note that there is a case in which the organic materials constituting the organic electroluminescent element 30 degrade through heat treatment. Therefore, it is preferable that the adhesive can be caused to adhere and be cured at temperatures from room temperature to 80° C. In addition, a drying agent may be dispersed in the adhesive.

Coating of the adhesive on the adhesion portion of the sealing material and the substrate 11 may be carried out using a commercially available dispenser, or by printing such as screen-printing.

Furthermore, when a gap is formed among the plate-like sealing material and the substrate 11 and the adhesive, it is preferable to inject an inert gas such as nitrogen or argon, or an inert liquid such as a fluorinated hydrocarbon or a silicone oil to the gap, in gaseous phase and liquid phase. In addition, it is also possible to be set vacuum. Additionally, it is also possible to enclose a hydroscopic compound into the gap.

Examples of the hydroscopic compound include a metal oxide (for example, sodium oxide, potassium oxide, calcium oxide, barium oxide, magnesium oxide, aluminum oxide and the like), a sulfate (for example, sodium sulfate, calcium sulfate, magnesium sulfate, cobalt sulfate and the like), a metal halide (for example, calcium chloride, magnesium chloride, cesium fluoride, tantalum fluoride, cesium brominate, magnesium brominate, barium iodide, magnesium iodide and the like), a perchloric acid (for example, barium perchloric acid salt, magnesium perchloric acid salt and the like), and the like. In the sulfate, metal halide and the perchloric acid, an anhydrous salt is suitably used.

In contrast, when using the sealing layer as the sealing material, the sealing membrane is provided on the substrate 11 in a state where the light-emitting functional layer 16 of the organic electroluminescent element 30 is completely covered and the terminal portions of the transparent conductor 20 and the counter electrode 17 of the organic electroluminescent element 30 are exposed.

The sealing layer is constituted using an inorganic material or an organic material. Particularly, the sealing membrane should be constituted by a material having function of suppressing the immersion of a substance which causes degradation of the light-emitting functional layer 16 in the organic electroluminescent element 30, such as moisture and oxygen. For example, an inorganic material such as silicon oxide, silicon dioxide or silicon nitride is used as such a material. Furthermore, in order to improve its fragility of the sealing layer, a lamination structure may be formed by using a layer formed of an organic material, in addition to the layer formed of the inorganic material.

The method for forming the layer is not particularly limited, and there can be used, for example, a vacuum deposition method, a sputtering method, a reactive sputtering method, a molecular beam epitaxy method, a cluster ion beam method, an ion plating method, a plasma polymerization method, an atmospheric plasma polymerization method, a plasma CVD method, a laser CVD method, a thermal CVD method, a coating method, and the like.

[Protective Layer, Protective Plate]

Note that, although the illustration here is omitted, a protective layer or a protective plate may be provided by sandwiching the organic electroluminescent element EL and the sealing material between the substrate 11. The protective layer or the protective plate is to mechanically protect the organic electroluminescent element EL, and particularly when the transparent sealing material is the protective layer, it is preferable to provide the protective layer or the protective plate since the mechanical protection of the organic electroluminescent element EL is not sufficient.

Examples of the protective layer or the protective plate to be applied include a glass plate, a polymer plate, a thinner polymer film, a metal plate, a thinner metal plate, or a membrane of polymer material and a membrane of metal material. Among them, from the viewpoint of light weight and small thickness, the polymer film is preferably used.

[Production Method of Organic Electroluminescent Element]

Here, as one example, the manufacturing method of the organic electroluminescent element 30 shown in FIG. 6 will be explained.

First, the second admittance-adjusting layer 22 is formed on the substrate 11 at a thickness of approximately 90 nm. Next, the first admittance-adjusting layer 21 is formed at a thickness of approximately 40 nm.

Next, the platinum group element-containing layer 13 is formed on the first admittance-adjusting layer 21 at a thickness of approximately 1 nm, and thereafter, the metal material layer 14 is formed so as to have a thickness of 3 nm to 15 nm. The platinum group element-containing layer 13 and the metal material layer 14 can be formed by the method described in the first embodiment. According to the above procedures, the transparent conductor 20 is produced on the substrate 11 on the anode side.

The method for forming the first admittance-adjusting layer 21 and the second admittance-adjusting layer 22 is the vapor deposition method (EB method or the like), the sputtering method, and the like, and particularly, the ion-assist EB vapor deposition method or the sputtering method is preferable from the viewpoint that a dense layer is easily obtained.

Next, thereon, a light-emitting functional layer 16 was formed by the formation of a positive hole injection layer 16a, a positive hole transport layer 16b, a light-emitting layer 16c, an electron transport layer 16d and an electron injection layer 16e in the order. There are employed, for the film formation of the layers, a spin coating method, a casting method, an ink-jet method, a vapor deposition method, a sputtering method, a printing method, and the like. From the viewpoints of easily obtaining a homogeneous membrane, of not easily generating a pinhole and the like, the vacuum deposition method or the spin coating method is particularly preferable. Furthermore, a different formation method may be employed to each layer. When employing the vapor deposition method for formation of each layer, although the vapor deposition conditions are varied depending on the kind of the compound to be used, it is desirable to select each condition optionally within the ranges of a heating temperature of boat for housing a compound of 50° C. to 450° C., a degree of vacuum of $10^{-6}$ Pa to $10^{-2}$ Pa, a vapor deposition rate of 0.01 nm/sec. to 50 nm/sec., a temperature of substrate of −50° C. to 300° C., and a thickness of membrane of 0.1 μm to 5 μm.

Next, a counter electrode 17 serving as a cathode is formed by an appropriate formation method such as a vapor deposition method or a sputtering method. At this time, pattern is formed in a shape of pulling out a terminal portion from the upper portion of the light emitting functional layer 16 to the peripheral of the substrate 11, while keeping an insulation state against the transparent conductor 20 by the light emitting functional layer 16.

As a result, the organic electroluminescent element 30 is obtained. Moreover, after that, there is provided the sealing material covering at least the light-emitting functional layer 16, in a state where the terminal portions of the transparent conductor 20 and the counter electrode 17 of the organic electroluminescent element 30 are exposed. At this time, the organic electroluminescent element 30 is sealed between the sealing material and the substrate 11 by causing the sealing material to adhere to the substrate 11 side with the adhesive.

By the above procedures, a desired organic electroluminescent element 30 is obtained on the substrate 11. In the production of the organic electroluminescent element 30, although it is preferable to perform production consistently from the light-emitting functional layer 16 to the counter electrode 17 through one-time vacuum drawing, it may be possible that the substrate 11 is extracted from the vacuum atmosphere to thereby be subjected to other different formation methods. At this time, it is necessary to consider that the procedures are carried out under a dry inert gas atmosphere.

In the case of applying a direct voltage to the organic electroluminescent element 30 thus obtained, a light emission can be observed when applying a voltage of 2 V or more to 40 V or less to the electrodes by setting the conductive layer 15 of the anode as + polarity and the counter electrode 17 of the cathode as − polarity. In addition, an alternating voltage may be applied. Note that a waveform of the alternating voltage to be applied may be optional.

Note that, although in the above-described embodiment, there is explained a configuration in which the transparent conductor of the second embodiment is applied to the organic elelctroluminescent element of the bottom emission type, the organic electroluminescent element can be constituted by using the transparent conductor of the first embodiment. Furthermore, the organic electroluminescent element to which the transparent conductor is applied is not limited to the bottom emission type, but may be, for example, a configuration of a top emission type in which light is extracted from the counter electrode side, or a configuration of a double-sided emission type in which a light is extracted from both sides. When the organic electroluminescent element is the top emission type, the organic electroluminescent element may have a configuration in which a transparent material is used for the counter electrode and also an opaque substrate having reflective property is used in instead of the transparent conductor, and emitted light h is taken out from the counter electrode side by reflecting on the substrate. When the organic electroluminescent element is the double-sided emission type, the organic electroluminescent element may have a configuration in which the same transparent material as the transparent conductor is used as the counter electrode and emitted light h is extracted from the both sides.

Moreover, in organic electroluminescent element of the bottom emission type, the top emission type and the double-sided emission type, there can also be employed a configuration in which the transparent conductor is used as the cathode, other than a configuration in which the transparent conductor is used as the anode, in the same way as the organic electroluminescent element of the third embodiment.

[Use of Organic Electroluminescent Element]

The organic electroluminescent elements having the above-described embodiments are surface emitting elements, and thus are usable for light-emitting sources of various types. Examples include a lighting device such as a home lighting device or a car lighting device, a backlight for a timepiece or a liquid crystal, a signboard for advertisement, a light source for a signal, a light source for an optical storage medium, a light source for an electrophotographic copier, a light source for an optical communication processor, a light source for an optical sensor, and the like. The organic electroluminescent elements are not limited to these light-emitting sources, and particularly, the organic electroluminescent element can be effectively used as a backlight for a liquid crystal display device which is combined with a color filter and as a light source for lighting.

Furthermore, the organic electroluminescent element of each of the embodiments may be used as a kind of lamp such as a lighting device or an exposure light source, or may be used as a projection device of an image projecting type, or a display of a type by which a still image or moving image is visually recognized directly. In this case, a light-emitting surface area may be enlarged by so-called tiling in which light-emitting panels provided with the organic electroluminescent element are combined flatly in response to the recent increasing in size of a lighting device and a display device.

When using the organic electroluminescent element as a display device for reproducing a moving image, a driving system is either a simple matrix (passive matrix) system or active matrix system. In addition, when using two or more kinds of the organic electroluminescent element of the present invention having a different emission color, it is possible to produce a color or full color display device.

4. Lighting Device (Fourth Embodiment)

[Lighting Device-1]

A fourth embodiment of the lighting device of the present invention will be explained. In the fourth embodiment, a lighting device using the organic electroluminescent element of the above-described third embodiment will be explained as one example of the electronic devices.

An organic electroluminescent element used in the lighting device of the present embodiment may be designed so as to impart a resonator structure to the each organic electroluminescent element having the configuration of the above-described third embodiment. The objects of using the organic electroluminescent element having the resonator structure include a light source for an optical storage medium, a light source for an electrophotographic copier, a light source for an optical communication processor, a light source for an optical sensor, and the like, but is not limited thereto. Alternatively, the organic electroluminescent element may be used for the above-described purpose by oscillating laser beam.

Note that the material used for the organic electroluminescent element can be applied to an organic electroluminescent element which emits a substantial white color light (also referred to as white color organic electroluminescent element). For example, the simultaneous emission of a plurality of luminescent colors from a plurality of light-emitting materials can also give a white color emission by color mixing. Examples of the combination of a plurality of luminescent colors may include a combination containing three maximum emission wavelengths of three primary colors of red, green and blue, or a combination containing two maximum emission wavelengths which are in a complementary color relationship such as blue and yellow, bluish green and orange, or the like.

Furthermore, combinations of light-emitting materials for obtaining a plurality of luminescent colors are either a combination of light-emitting materials which emit a plurality of phosphorescence or fluorescence, or a combination of a light-emitting material which emit a plurality of phosphorescence or fluorescence and a material of coloring matter which emits an excitation light from a light-emitting material. In the white color organic electroluminescent element, a plurality of light-emitting dopants may be combined.

The white color organic electroluminescent element has a configuration different from the configuration of obtaining a white color emission by arranging, in parallel, organic electroluminescent elements each of which emits an individual color light, in an array form, and the organic electroluminescent element itself can emit a white color light. Therefore, it is not necessary to use a mask for formation of most of layers constituting the element, and thus, for example, the conductive layer can be formed all over by a vapor deposition method, a casting method, a spin coating method, an ink-jet method, a printing method, and the like, which enhances productivity.

Furthermore, the light-emitting materials to be used for the light-emitting layers of the white color organic electroluminescent element are not particularly limited, and for example, as to a backlight in a liquid crystal display element, whiting is performed by selection and combination of arbitrary materials from among the metal complexes described in the above-described embodiment of the organic electroluminescent element or well-known light-emitting materials so as to be suited to a wavelength range corresponding to a CF (color filter) property.

It is possible to produce a lighting device which emits substantial white light, by using the white color organic electroluminescent element explained above.

[Lighting Device-2]

Furthermore, the organic electroluminescent element can be used as a lighting device having an enlarged light-emitting area by, for example, using a plurality of the elements. In this case, the enlargement of the light-emitting area can be done by arranging (that is, tiling), on a support substrate, a plurality of light-emitting panels provided with the organic electroluminescent elements on a substrate. The support substrate may also double as a sealing material, and the light-emitting panels are tiled in a state where the organic electroluminescent elements are sandwiched between the support substrate and the substrate of the light-emitting panel. The organic electroluminescent element may be sealed by filling an adhesive between the support substrate and the transparent conductor. Note that terminals of the transparent conductor and the counter electrode are exposed around the light-emitting panel.

In the lighting device having such a configuration, a non-light-emitting region is generated between the light-emitting panels since the center region of the light-emitting panel serves as the light-emitting region. Therefore, in order to increase an amount of light to be extracted from the non-light-emitting region, a light extraction member may be provided in the non-light-emitting region of the light extraction surface. A light condensing sheet or a light diffusing sheet can be used for the light extraction member.

Example 1

Hereinafter, the present invention will be explained by referring examples, but is not limited thereto.

[Production of Transparent Conductor]

Each of transparent conductors of Samples 101 to 114 was produced so that an area of an electrical conductivity region was 5 cm×5 cm. The following Table 1 shows the configuration of each layer in each of the transparent conductor of Samples 101 to 114.

[Production of Transparent Conductors of Samples 101 and 102]

In the following way, a conductive layer formed of silver having a film thickness shown in Table 1 was formed on a substrate made of polyethylene terephthalate (PET).

First, a substrate formed of PET was fixed onto a substrate holder of a commercial vacuum vapor-deposition apparatus, and then attached to a vacuum tank of the vacuum vapor-deposition apparatus. Silver (Ag) was placed in a tungsten resistive heating boat. After reducing a pressure of the vacuum tank to $4\times10^{-4}$ Pa, the heating boat was heated by applying an electric current, and there was formed a conductive layer constituted of silver having each of desired thicknesses at a vapor deposition rate of 0.1 nm/sec to 0.2 nm/sec. The thickness of Sample 101 was 8 nm, and the thickness of Sample 102 was 12 nm.

[Production of Transparent Conductor of Sample 103]

In the following way, the admittance-adjusting layer made of indium oxide (ITO) having a thickness of 40 nm was formed on the substrate made of PET, and the conductive layer made of silver having a thickness of 8 nm was formed in the upper portion thereof.

First, a t substrate made of PET was fixed onto a substrate holder of a commercial electron beam vapor-deposition apparatus, indium oxide (ITO) was placed in the heating boat, and then the substrate holder and the heating boat were attached to a vacuum tank of the electron beam vapor-deposition apparatus. In addition, silver (Ag) was placed in a tungsten resistive heating boat, and was attached to the vacuum tank of the commercial vacuum vapor-deposition apparatus.

Next, after reducing a pressure of the vacuum tank of the electron beam vapor-deposition apparatus to $4\times10^{-4}$ Pa, the heating boat obtained by placing indium oxide (ITO) was irradiated with the electron beam for heating, and the admittance-adjusting layer made of ITO having a film thickness of 40 nm was provided on the substrate, at a vapor deposition rate of 0.1 nm/sec to 0.2 nm/sec.

Subsequently, the base material obtained by forming a layer up to the admittance-adjusting layer was transferred to the vacuum tank of the vacuum vapor-deposition apparatus under vacuum, and after reducing a pressure of the vacuum tank to $4\times10^{-4}$ Pa, the heating boat containing silver was heated by applying an electric current. Therefore, the conductive layer made of silver having a thickness of 8 nm was formed at a vapor deposition rate of 0.1 nm/sec to 0.2 nm/sec, with the result that there was obtained the transparent conductor of Sample 103 having a lamination structure of the admittance-adjusting layer and the conductive layer in the upper portion thereof.

[Production of Transparent Conductor of Sample 104]

A transparent conductor of Sample 104 was obtained in the same procedures as in the above Sample 103 except that the admittance-adjusting layer was constituted of titanium oxide ($TiO_2$).

[Production of Transparent Conductor of Sample 105]

In the following way, the high refractive layer made of indium oxide (ITO) having a thickness of 40 nm was formed on the substrate made of PET. Furthermore, the platinum group element-containing layer (Pd layer) made of palladium (Pd) was formed in a thickness of 0.1 nm, and the metal material layer made of silver was formed in a thickness of 6 nm, as the conductive layer in the upper portion thereof.

First, a substrate made of PET was fixed onto a substrate holder of a commercial electron beam vapor-deposition apparatus, indium oxide (ITO) was placed in the heating boat, and then the substrate holder and the heating boat were attached to a vacuum tank of the electron beam vapor-deposition apparatus. Next, a palladium (Pd) target was attached to a vacuum tank of the sputtering apparatus. In addition, silver (Ag) was placed in the tungsten resistive heating boat, and was attached to the vacuum tank of the vacuum vapor-deposition apparatus.

Subsequently, after reducing a pressure of the vacuum tank of the electron beam vapor-deposition apparatus to $4 \times 10^{-4}$ Pa, the heating boat obtained by placing ITO was irradiated with the electron beam for heating, and the admittance-adjusting layer made of ITO having a thickness of 40 nm was provided on the substrate, at a vapor deposition rate of 0.1 nm/sec to 0.2 nm/sec.

After that, the substrate obtained by forming a layer up to the admittance-adjusting layer was transferred, in a vacuum state, to the vacuum tank of the sputtering apparatus, and after reducing a pressure of the vacuum tank to $4 \times 10^{-4}$ Pa, the platinum group element-containing layer composed of Pd was provided on the admittance-adjusting layer at a thickness of 0.1 nm, by applying an electric voltage to a Pd target.

Next, the substrate obtained by forming a layer up to the platinum group element-containing layer was transferred, in a vacuum state, to the vacuum tank, and after reducing a pressure of the vacuum tank to $4 \times 10^{-4}$ Pa, the resistive heating boat obtained by placing silver was heated by applying an electric current, and then a metal material layer made of silver having a thickness of 6 nm was formed at a vapor deposition rate of 0.1 nm/sec to 0.2 nm/sec, with the result that there was obtained a transparent conductor of Sample 105 formed by laminating admittance-adjusting layer, and the conductive layer composed of the platinum group element-containing layer and the metal material layer in this order.

[Production of Transparent Conductor of Sample 106]

A transparent conductor of Sample 106 was obtained in the same procedures as in the above Sample 105 except that the admittance-adjusting layer was constituted of titanium oxide ($TiO_2$).

[Production of Transparent Conductor of Sample 107]

A transparent conductor of Sample 107 was obtained in the same procedures as in the above Sample 105 except that the admittance-adjusting layer was constituted of niobium oxide ($Nb_2O_5$).

[Production of Transparent Conductor of Sample 108]

A transparent conductor of Sample 108 was obtained in the same procedures as in the above Sample 105 except that the thickness of the metal material layer made of silver was 8 nm.

[Production of Ttransparent Conductor of Sample 109]

A transparent conductor of Sample 109 was obtained in the same procedures as in the above Sample 106 except that the thickness of the metal material layer made of silver was 8 nm.

[Production of Transparent Conductor of Sample 110]

A transparent conductor of Sample 110 was obtained in the same procedures as in the above Sample 107 except that the thickness of the metal material layer made of silver was 8 nm.

[Production of Transparent Conductor of Sample 111]

A transparent conductor of Sample 111 was obtained in the same procedures as in the above Sample 107 except that the thickness of the metal material layer made of silver was 10 nm.

[Production of Transparent Conductor of Sample 112]

A transparent conductor of Sample 112 was obtained in the same procedures as in the above Sample 107 except that the thickness of the metal material layer made of silver was 12 nm.

[Production of Transparent Conductor of Sample 113]

In the following way, the second admittance-adjusting layer made of magnesium fluoride ($MgF_2$) having a thickness of 180 nm was formed on the substrate made of PET, and the first admittance-adjusting layer made of titanium oxide ($TiO_2$) having a thickness of 40 nm was formed in the upper portion thereof. In addition, the platinum group element-containing layer (Pd layer) made of palladium (Pd) was formed in the upper portion thereof at a thickness of 0.1 nm, and the metal material layer made of silver was formed at a thickness of 8 nm in the upper portion thereof.

First, a substrate made of PET was fixed onto a substrate holder of a commercial electron beam vapor-deposition apparatus, magnesium fluoride ($MgF_2$) was placed in the heating boat, and then the substrate holder and the heating boat were attached to a vacuum tank of the electron beam vapor-deposition apparatus. Furthermore, titanium oxide ($TiO_2$) was placed in the heating boat, and then was attached to a vacuum tank of the electron beam vapor-deposition apparatus.

Next, a palladium (Pd) target was attached to a vacuum tank of the sputtering apparatus. In addition, silver (Ag) was placed in the tungsten resistive heating boat, and attached to the vacuum tank of the vacuum vapor-deposition apparatus.

Subsequently, after reducing a pressure of the vacuum tank of the electron beam vapor-deposition apparatus to $4 \times 10^{-4}$ Pa, the heating boat obtained by placing magnesium fluoride ($MgF_2$) was irradiated with the electron beam for heating, and the second admittance-adjusting layer made of magnesium fluoride having a thickness of 180 nm was provided on the substrate, at a vapor deposition rate of 0.1 nm/sec to 0.2 nm/sec.

Furthermore, the heating boat obtained by placing titanium oxide ($TiO_2$) was irradiated with the electron beam for heating, and the first admittance-adjusting layer made of titanium oxide having a thickness of 40 nm was provided on the second admittance-adjusting layer, at a vapor deposition rate of 0.1 nm/sec to 0.2 nm/sec.

Subsequently, the substrate obtained by forming a layer up to the first admittance-adjusting layer was transferred, in a vacuum state, to the vacuum tank of the sputtering apparatus, and after reducing a pressure of the vacuum tank to $4 \times 10^{-4}$ Pa, an electric voltage was applied to the Pd target to form the platinum group element-containing layer composed of Pd was provided on the first admittance-adjusting layer at a thickness of 0.1 nm, by applying an electric voltage to the Pd target.

After that, the substrate obtained by forming a layer up to the platinum group element-containing layer was transferred, in a vacuum state, to the vacuum tank of the vacuum vapor-deposition apparatus, and after reducing a pressure of the vacuum tank to $4 \times 10^{-4}$ Pa, the heating boat containing silver was heated by applying an electric current, and then a metal material layer made of silver having a thickness of 8 nm was formed at a vapor deposition rate of 0.1 nm/sec to 0.2 nm/sec, with the result that there was obtained a transparent conductor of Sample 113 obtained by laminating the second admittance-adjusting layer, the first admittance-adjusting layer, and the conductive layer composed of the platinum group element-containing layer and the metal material layer in this order.

[Production of Transparent Conductor of Sample 114]

A transparent conductor of Sample 114 was obtained in the same procedures as in the above Sample 113 except that the second admittance-adjusting layer made of magnesium fluoride ($MgF_2$) has a thickness of 90 nm, and the first admittance-adjusting layer made of niobium oxide ($Nb_2O_5$) was formed at a thickness of 25 nm.

[Production of Transparent Conductor of Sample 115]

A transparent conductor of Sample 115 was obtained in the same procedures as in the above Sample 107 except that the thickness of the metal material layer made of silver was 15 nm.

[Production of Transparent Conductor of Sample 116]

A transparent conductor of Sample 116 was obtained in the same procedures as in the above Sample 107 except that the thickness of the metal material layer made of silver was 16 nm.

[Evaluation of Each Sample in Example 1]

The determination of the optical admittance and the measurement of the absorption rate (average absorption rate, maximum absorption rate, plasmon absorption rate: %) were carried out as optical properties of each transparent conductor in Samples 101 to 116 produced by the above procedures.

As to each transparent conductor of Samples 101 to 116, the visual light average transmissivity (%), and the surface resistance ($\Omega$/sq.) were measured.

In addition, the determination of the optical admittance, and the measurements of the absorption rate (%), the visual light average transmissivity (%), and the surface resistance ($\Omega$/sq.) were carried out in the following.

[Method for Determination of Admittance]

The admittance of each interface constituting the transparent conductor was calculated by using a thin film designing software Essential Macleod Ver. 9.4.375. Note that the thickness d, the refractive index n, and the absorption coefficient k of each layer, which are necessary for calculation, were measured by the ellipsometer VB-250 Type VASE manufactured by J. A. Woollam Co. Inc.

[Method for Measuring Average Absorption Rate, Maximum Absorption Rate]

The average transmissivity and average reflection coefficient were measured by entering light for measurement (light having a wavelength of 450 nm to 800 nm) from an angle inclined by 5 degrees relative to the front surface of the transparent conductor, by a spectrophotometer U4100: manufactured by HITACHI Co., Ltd. Furthermore, the average absorption rate was calculated according to the equation: 100−(average transmissivity+average reflection coefficient). Note that the incident light for measurement entered from the substrate side.

Moreover, in the same way as the above, the transmissivity and reflection coefficient at a wavelength of 450 nm to 800 nm were measured. In addition, the absorption rate at each wavelength was calculated according to the equation: 100−(transmissivity+reflection coefficient), and the maximum value obtained was set to be a maximum absorption rate.

[Method for Measuring Plasmon Absorption Rate]

The plasmon absorption rate of the conductive layer was measured as follows.

First, palladium was formed on the transparent glass substrate at a thickness of 0.2 s (0.1 nm) by using a magnetron sputtering apparatus (MSP-1S) manufactured by Vacuum Device Co., Ltd. The average thickness of palladium was calculated from the known film formation rate presented by the maker of the sputtering apparatus. After that, silver was formed at a thickness of 20 nm on the substrate where palladium was deposited, by using BMC-800T vapor-deposition machine manufactured by Synclon Co., Ltd. At this time, the resistance heating was set to 210 A, and the film formation rate was set to 5 Å/s.

The reflection coefficient and the transmissivity of the conductive layer thus obtained were measured, and the absorption rate was calculated as absorption rate=100−(transmissivity+reflection coefficient). Assuming that the conductive layer does not have plasmon absorption, the plasmon absorption rate was calculated by subtracting the absorption rate of the conductive layer of the transparent conductor of each sample produced in the examples from the measured data.

The light transmissivity and reflection coefficient were measured by a spectrophotometer U4100: manufactured by HITACHI Co., Ltd.

[Method for Measuring Visual Light Average Transmissivity]

Measurement of the light transmissivity was carried out by using a spectrophotometer (U-3300 manufactured by HITACHI), and the average light transmissivity was measured by using, as a baseline, a substrate that is the same as the sample, in measurement light (light having a wavelength of 450 nm to 800 nm).

[Method for Measuring Surface Resistance]

Measurement of the surface resistance was carried out by using a resistivity meter (MCP-T610 manufactured by MITSUBISHI CHEMICALS), and by 4 terminals 4 probes method constant current applying system.

The configuration of Samples 101 to 116, and the measured results of the optical admittance, absorption rate (%), the visual light average transmissivity (%), and the surface resistance ($\Omega$/sq.) are shown in the following Table 1.

TABLE 1

| | | Configuration of Example ||||||
| | | Configuration of transparent conductor ||||||
| | | Second | | First | | Conductive layer ||
| Sample No. | Substrate | admittance adjusting layer | Film thickness nm | admittance adjusting layer | Film thickness nm | Pd layer | Metal material layer | Film thickness nm |
|---|---|---|---|---|---|---|---|---|
| 101 | PET | — | — | — | — | Without | Ag | 8 |
| 102 | ↓ | — | — | — | — | Without | Ag | 12 |
| 103 | ↓ | — | — | ITO | 40 | Without | Ag | 8 |
| 104 | ↓ | — | — | $TiO_2$ | 40 | Without | Ag | 8 |
| 105 | ↓ | — | — | ITO | 40 | With | Ag | 6 |

TABLE 1-continued

| | | | | | | | | |
|---|---|---|---|---|---|---|---|---|
| 106 | ↓ | — | — | TiO$_2$ | 40 | With | Ag | 6 |
| 107 | ↓ | — | — | Nb$_2$O$_5$ | 40 | With | Ag | 6 |
| 108 | ↓ | — | — | ITO | 40 | With | Ag | 8 |
| 109 | ↓ | — | — | TiO$_2$ | 40 | With | Ag | 8 |
| 110 | ↓ | — | — | Nb$_2$O$_5$ | 40 | With | Ag | 8 |
| 111 | ↓ | — | — | Nb$_2$O$_5$ | 40 | With | Ag | 10 |
| 112 | ↓ | — | — | Nb$_2$O$_5$ | 40 | With | Ag | 12 |
| 113 | ↓ | MgF$_2$ | 180 | TiO$_2$ | 40 | With | Ag | 8 |
| 114 | ↓ | MgF$_2$ | 90 | Nb$_2$O$_5$ | 25 | With | Ag | 8 |
| 115 | ↓ | — | — | Nb$_2$O$_5$ | 40 | With | Ag | 15 |
| 116 | ↓ | — | — | Nb$_2$O$_5$ | 40 | With | Ag | 16 |

| | Optical properties | | | | | | | Evaluation results | | |
|---|---|---|---|---|---|---|---|---|---|---|
| | | | | | | Absorption rate | | Visual light | | |
| Sample No. | Optical admittance | | | | | Average absorption rate % | Maximum absorption rate % | Plasmon absorption rate % | average permeability % | Surface resistance Ω/sq. | Note |
| | x1 | y1 | x2 | y2 | y1 × y2 | | | | | | |
| 101 | 1.52 | 0 | 1.42 | −0.96 | 0.00 | >15% | >25% | >10% | 47.2 | 58.2 | Comparative |
| 102 | 1.52 | 0 | 1.29 | −1.38 | 0.00 | >15% | <25% | <10% | 61.5 | 15.2 | Comparative |
| 103 | 1.78 | 0.30 | 1.73 | −0.76 | −0.23 | >15% | >25% | >10% | 58.5 | 34.3 | Comparative |
| 104 | 2.18 | 0.69 | 2.24 | −0.54 | −0.37 | >15% | >25% | >10% | 57.5 | 38.3 | Comparative |
| 105 | 1.78 | 0.30 | 1.78 | −0.50 | −0.15 | 12% | 22% | 18% | 68.2 | 14.0 | Present invention |
| 106 | 2.18 | 0.69 | 2.27 | −0.23 | −0.16 | 12% | 20% | 16% | 68.5 | 13.4 | Present invention |
| 107 | 2.79 | 1.13 | 3.03 | −0.01 | −0.01 | 12% | 20% | 16% | 68.6 | 12.4 | Present invention |
| 108 | 1.78 | 0.30 | 1.73 | −0.76 | −0.23 | 9% | 10% | 5% | 71.1 | 9.5 | Present invention |
| 109 | 2.18 | 0.69 | 2.24 | −0.54 | −0.37 | 8% | 9% | 4% | 72.2 | 9.8 | Present invention |
| 110 | 2.79 | 1.13 | 3.01 | −0.41 | −0.46 | 7% | 9% | 4% | 73.2 | 8.1 | Present invention |
| 111 | 2.79 | 1.13 | 2.93 | −0.80 | −0.90 | 7% | 9% | 3% | 73.5 | 7.9 | Present invention |
| 112 | 2.79 | 1.13 | 2.82 | −1.16 | −1.30 | 7% | 9% | 1% | 73.4 | 7.5 | Present invention |
| 113 | 2.34 | 0.77 | 2.42 | −0.53 | −0.41 | 6% | 9% | 4% | 74.4 | 8.2 | Present invention |
| 114 | 3.00 | 1.19 | 3.23 | −0.47 | −0.56 | 6% | 9% | 4% | 74.6 | 8.1 | Present invention |
| 115 | 2.79 | 1.13 | 2.58 | −1.63 | −1.84 | 14% | 24% | 0% | 65.3 | 7.2 | Present invention |
| 116 | 2.79 | 1.13 | 2.49 | −1.77 | −2.00 | 17% | 27% | 0% | 61.9 | 7.1 | Comparative |

[Evaluation Result of Example 1]

In the transparent conductor of each of Samples 105 to 116 in which the admittance-adjusting layer, and the conductive layer constituted of the platinum group element-containing layer and the metal material layer were formed in this order, each of the absorption rate was low, and excellent results were also obtained in the visual light average transmissivity and the surface resistance.

In Samples 101 to 104, since the Pd layer as the platinum group element-containing layer is not formed, the Ag layer constituting the conductive layer has poor uniformity in comparison with Sample 105 to 116 in which the Pd layer was formed, the light absorption rate of the transparent conductor is large. Therefore, the visual light average transmissivity and the surface resistance are also lowered.

In addition, among Samples 101 to 104, visual light average transmissivity of each of Samples 103 and 104 provided with the admittance-adjusting layer is enhanced in comparison with Sample 101 not provided with the admittance-adjusting layer. This result shows that the transmissivity of the transparent conductor is enhanced by provision of the admittance-adjusting layer.

Samples 105 to 107 and Samples 108 to 110 are the samples in which the admittance-adjusting layer is composed of ITO, TiO$_2$, Nb$_2$O$_5$, and the thicknesses of the metal material layers are different from one another. In the sample having the same thickness of the conductive layer, when the optical admittance $x_1$ and $x_2$ are large, the light absorption rate of the transparent conductor is lowered. Particularly, Sample 106, Sample 107, Sample 109 and Sample 110 in which $x_1$ and $x_2$ are 2.0 or more are lowered in the maximum absorption of the transparent conductor in comparison with Sample 105 and Sample 108 in which $x_1$ and $x_2$ are less than 1.8.

Furthermore, each of Sample 107 and Sample 110 having the largest $x_1$ and $x_2$ has the lowest light absorption rate. Therefore, it is found that the light absorption rate of the transparent conductor becomes low by making $x_1$ and $x_2$ large.

On the other hand, with respect to the visual light average transmissivity, in Sample 106 and Sample 109 using TiO$_2$ in which $x_1$ and $x_2$ have medium values between ITO and Nb$_2$O$_5$, the best result was obtained.

From the result, when $x_1$ and $x_2$ becomes too large, the light absorption rate of the transparent conductor is lowered, but since the reflection on the conductive layer is increased, it is considered that a factor that lowers the visual light average transmissivity of the transparent conductor accordingly is caused.

In Sample 111 and Sample 112 in which the metal material layers have, respectively, the thicknesses of 10 nm and 12 nm, since the homogeneity or the like of the conductive layer is enhanced by increasing the thickness of the conductive layer, the plasmon absorption rate is lowered in comparison with Sample 107 and Sample 110. On the other hand, the absorption of the conductivity itself is increased by increasing the thickness of the conductive layer, and thus there is not a large difference in the visual light average transmissivity of the transparent conductor between Samples 110 to 112. Accordingly, when the thickness of the conductive layer is set to 8 nm or more, it is possible to enhance the film quality of the conductive layer and enhance the transmissivity of the transparent conductor. However, when the thickness of the conductive layer is larger than 15 nm, the thickness of the conductive layer is required to be 15 nm or less since the increase in the absorption of the conductive layer itself becomes larger than the decrease in the plasmon absorption rate.

In Sample 113 and Sample 114 in which two admittance-adjusting layers are provided, the average absorption rate is lowered and the visual light average transmissivity is enhanced in comparison with Sample 109 and Sample 110 in which the conductive layer having the same thickness is provided. As described above, as in Sample 113 and Sample 114, the optical admittance of the conductive layer can be easily adjusted by forming a plurality of the admittance-adjusting layers. In addition, the light transmissivity of the transparent conductor can be enhanced by preferably adjusting the optical admittance of the conductive layer.

Example 2

[Production of Bottom Emission Type Organic Electroluminescent Element]

Figure 7:
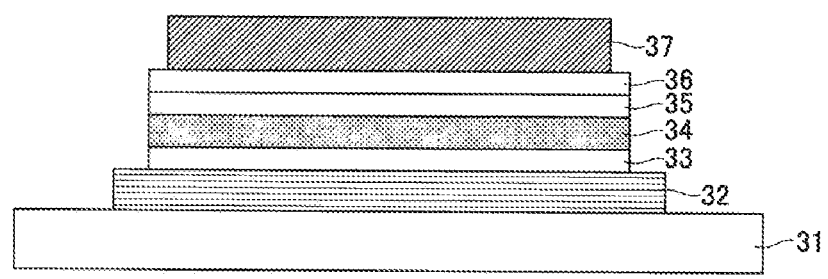
FIG. 7 is a drawing showing a schematic configuration of a bottom emission type organic electroluminescent element produced in Example 2.

There was produced each of bottom emission type organic electroluminescent elements (organic EL elements) of Samples 201 to 216 obtained by providing each transparent conductor of Sample 101 to 116 produced in Example 1 under the light-emitting functional layer as an anode. The production procedures are explained by referring to FIG. 7. Note that the following Table 2 shows the configuration of the transparent conductor used in each of the organic electroluminescent elements of Samples 201 to 216. Each of the transparent conductor of Sample 101 to 116 of Example 1 which has the same two digit sample number was used for each of the organic electroluminescent element of Sample 201 to 216.

[Production Procedures of Organic Electroluminescent Element of Samples 201 to 216]

(Formation of Transparent Conductor)

First, in the production of Samples 201 to 216, each transparent conductor 32 was formed in the upper portion of a substrate 31 made of an alkali free glass or polyethylene terephthalate (PET). Each transparent conductor 32 was formed in the same procedures as in Samples 101 to 116 of Example 1.

(Formation of Positive Hole Transport-Injection Layer)

First, the heating boat in which α-NPD represented by the following structural formula was placed as a positive hole transport injection material was heated by applying an electric current, and thus the positive hole transport-injection layer 33 constituted of α-NPD and combining the positive hole injection layer with the positive hole transport layer was formed on the transparent conductor 32. At this time, the vapor deposition rate was 0.1 nm/sec to 0.2 nm/sec, and the thickness was 20 nm.

[Chem. 5]

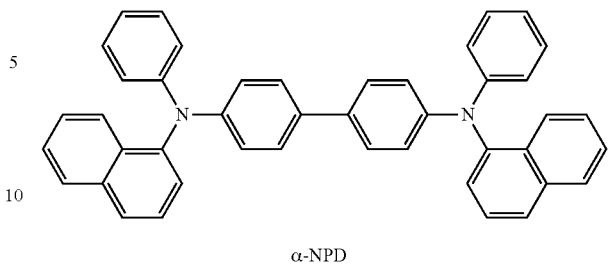

α-NPD (Formation of Light-Emitting Layer)

Next, the heating boat in which the host material H4 previously represented by the structural formula was placed and the heating boat in which the phosphorescence-emitting compound Ir-4 previously represented by the structural formula was placed were independently heated by applying an electric current, and the light-emitting layer 34 constituted of the host material H4 and the phosphorescence-emitting compound Ir-4 were formed on the positive hole transport-injection layer 33. At that time, the current to be applied was controlled so that the vapor deposition rate of the host material H4: the phosphorescence-emitting compound Ir-4=100:6 holds. The film thickness was set to be 30 nm.

(Formation of Positive Hole Blocking Layer)

Next, the heating boat in which BAlq represented by the following structural formula was placed as a positive hole block material was heated by applying an electric current, and thus the positive hole blocking layer 35 constituted of BAlq was formed on the light-emitting layer 34. At this time, the vapor deposition rate was set to be 0.1 nm/sec to 0.2 nm/sec, and the thickness was set to be 10 nm.

[Chem. 6]

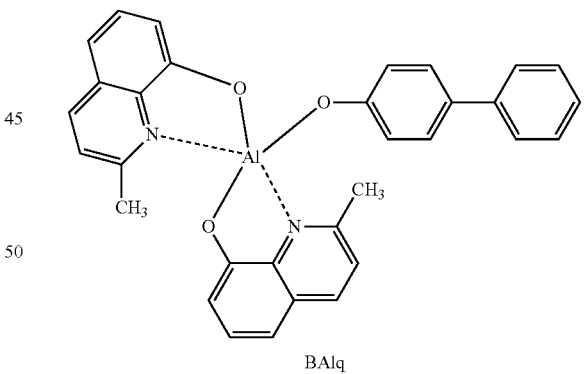

BAlq (Formation of Electron Transport-Injection Layer)

After that, the heating boat in which Compound 10 represented by the structural formula before as the electron transport material was placed and the heating boat in which potassium fluoride was placed were independently heated by applying an electric current, and thus the electron transport-injection layer 36 constituted of Compound 10 and the potassium fluoride, and combining electron transport layer with the electron injection layer was formed on the positive hole blocking layer 35. At that time, the current to be applied was controlled so that the vapor deposition rate of Compound 10: the potassium fluoride=75:25 holds. In addition, the thickness was set to be 30 nm.

(Counter Electrode: Formation of Cathode)

After the above, the substrate 31 obtained by forming the light-emitting functional layer was transferred to the second vacuum tank of the vacuum evaporator, and after reducing a pressure of the second vacuum tank to $4 \times 10^{-4}$ Pa, the heating boat provided in the second vacuum tank and containing aluminum was heated by applying an electric current. Thereby, a counter electrode 37 of aluminum having a thickness of 100 nm was formed at a vapor deposition rate of 0.3 nm/sec. The counter electrode 37 is used as a cathode. According to the above procedures, an organic electroluminescent element of bottom emission type was formed on the substrate 31.

(Sealing of Element)

After that, the organic electroluminescent element was covered by a sealing material formed of a glass substrate having a thickness of 300 μm, and an adhesive (sealing material) was filled in the space between the transparent sealing material and the substrate 31 in a state of covering the organic electroluminescent element. An epoxy-based photocurable adhesive (Lackstrack LC0629B manufactured by TOAGOSEI) was used as the adhesive. The adhesive filled in the space between the transparent sealing material and the substrate 31 was irradiated with UV light from the glass substrate (sealing material) side, the organic electroluminescent element was sealed by curing the adhesive.

Note that, in the formation of the organic electroluminescent element, by using a vapor deposition mask for forming each layer, 4.5 cm×4.5 cm in the center of the substrate 31 of 5 cm×5 cm was set as a light-emitting region A, and a non-light-emitting region B was provided around the whole peripheral of the light-emitting region A with a width of 0.25 cm. Furthermore, the conductive layer of the transparent conductor 32 of an anode and the counter electrode 37 of a cathode were formed in a state of being insulated by the positive hole transport-injection layer 33 to the electron transport-injection layer 36, and in the form of pulling out the terminal portion to the peripheral of the substrate 31.

As described above, each of the light-emitting panels of the organic electroluminescent element of Samples 201 and 216 was obtained by providing the organic electroluminescent element on the substrate 31, and sealing with the transparent sealing material and the adhesive. In the respective light-emitting panel, the emitted light h of each color generated in the light-emitting layer 34 was extracted from the substrate 31 side.

[Evaluation of Each Sample of Example 2]

As to the organic electroluminescent element produced in Samples 201 to 216, the driving voltage (V), and the color change (Δxy) were measured. The results are shown in the following Table 2 together.

[Method for Measuring Driving Voltage]

In the measurement of the driving voltage, a voltage in which a front luminance at the transparent conductor 32 side (namely, the substrate 31 side) of each of the organic electroluminescent elements of Samples 201 to 216 is 1000 cd/m$^2$ is the driving voltage. Note that the spectral emission luminance meter CS-1000 (manufactured by CONIKA MINOLTA SENCING) was used in order to measure the luminance. The smaller the obtained voltage is, the better the result is.

[Method for Measuring Color Change]

Furthermore, in the measurement of the color change, the chromaticity in the CIE1931 colorimetric system was measured from positions of different angles, by applying a current of 2.5 mA/cm$^2$ to the organic electroluminescent element of Sample 201 to 216. At this time, there were measured chromaticities at the position of 0 degree which correspond to the normal direction with respect to the light-emitting surface on the transparent conductor 32 side, and at the positions of 45 degrees from the vertical and horizontal (up and down, right and left) directions. The difference in chromaticities measured at the positions of different angles is shown in the following Table 2 as the color change (Δxy). The color change indicates viewing angle characteristics, and the smaller the value is, the more preferable the result becomes.

The configuration of Samples 201 to 216, and the measurement results of the driving voltage (V), and the chromaticity difference (Δxy) are shown in the following Table 2.

TABLE 2

| | | Configuration of Example | | | | | | |
|---|---|---|---|---|---|---|---|---|
| | | Configuration of transparent conductor | | | | | | |
| | | Second | | First | | Conductive layer | | |
| Sample No. | Substrate | admittance adjusting layer | Film thickness nm | admittance adjusting layer | Film thickness nm | Pd layer | Metal material layer | Film thickness nm |
| 201 | PET | — | — | — | — | Without | Ag | 8 |
| 202 | ↓ | — | — | — | — | Without | Ag | 12 |
| 203 | ↓ | — | — | ITO | 40 | Without | Ag | 8 |
| 204 | ↓ | — | — | TiO$_2$ | 40 | Without | Ag | 8 |
| 205 | ↓ | — | — | ITO | 40 | With | Ag | 6 |
| 206 | ↓ | — | — | TiO$_2$ | 40 | With | Ag | 6 |
| 207 | ↓ | — | — | Nb$_2$O$_5$ | 40 | With | Ag | 6 |
| 208 | ↓ | — | — | ITO | 40 | With | Ag | 8 |
| 209 | ↓ | — | — | TiO$_2$ | 40 | With | Ag | 8 |
| 210 | ↓ | — | — | Nb$_2$O$_5$ | 40 | With | Ag | 8 |
| 211 | ↓ | — | — | Nb$_2$O$_5$ | 40 | With | Ag | 10 |
| 212 | ↓ | — | — | Nb$_2$O$_5$ | 40 | With | Ag | 12 |
| 213 | ↓ | MgF$_2$ | 180 | TiO$_2$ | 40 | With | Ag | 8 |
| 214 | ↓ | MgF$_2$ | 90 | Nb$_2$O$_5$ | 25 | With | Ag | 8 |
| 215 | ↓ | — | — | Nb$_2$O$_5$ | 40 | With | Ag | 15 |
| 216 | ↓ | — | — | Nb$_2$O$_5$ | 40 | With | Ag | 16 |

TABLE 2-continued

| Sample | Optical admittance | | | | | Absorption rate | | | Evaluation results | | Note |
| --- | --- | --- | --- | --- | --- | --- | --- | --- | --- | --- | --- |
| | | | | | | Average absorption | Maximum absorption | Plasmon absorption | Driving voltage | Color change | |
| No. | x1 | y1 | x2 | y2 | y1 × y2 | rate % | rate % | rate % | V | $\Delta$xy | |
| 201 | 1.52 | 0 | 1.42 | −0.96 | 0.00 | >15% | >25% | >10% | No emission | | Comparative |
| 202 | 1.52 | 0 | 1.29 | −1.38 | 0.00 | >15% | <25% | <10% | <5 | 0.15 | Comparative |
| 203 | 1.78 | 0.30 | 1.73 | −0.76 | −0.23 | >15% | >25% | >10% | No emission | | Comparative |
| 204 | 2.18 | 0.69 | 2.24 | −0.54 | −0.37 | >15% | >25% | >10% | No emission | | Comparative |
| 205 | 1.78 | 0.30 | 1.78 | −0.50 | −0.15 | 12% | 22% | 18% | 6 | 1.10 | Present invention |
| 206 | 2.18 | 0.69 | 2.27 | −0.23 | −0.16 | 12% | 20% | 16% | 6 | 0.06 | Present invention |
| 207 | 2.79 | 1.13 | 3.03 | −0.01 | −0.01 | 12% | 20% | 16% | 6 | 0.06 | Present invention |
| 208 | 1.78 | 0.30 | 1.73 | −0.76 | −0.23 | 9% | 10% | 5% | <5 | 0.05 | Present invention |
| 209 | 2.18 | 0.69 | 2.24 | −0.54 | −0.37 | 8% | 9% | 4% | <5 | 0.03 | Present invention |
| 210 | 2.79 | 1.13 | 3.01 | −0.41 | −0.46 | 7% | 9% | 4% | <5 | 0.03 | Present invention |
| 211 | 2.79 | 1.13 | 2.93 | −0.80 | −0.90 | 7% | 9% | 3% | <5 | 0.04 | Present invention |
| 212 | 2.79 | 1.13 | 2.82 | −1.16 | −1.3 | 7% | 9% | 1% | <5 | 0.05 | Present invention |
| 213 | 2.34 | 0.77 | 2.42 | −0.53 | −0.41 | 6% | 9% | 4% | <5 | 0.02 | Present invention |
| 214 | 3.00 | 1.19 | 3.23 | −0.47 | −0.56 | 6% | 9% | 4% | <5 | 0.02 | Present invention |
| 215 | 2.79 | 1.13 | 2.58 | −1.63 | −1.84 | 14% | 24% | 0% | <5 | 0.07 | Present invention |
| 216 | 2.79 | 1.13 | 2.49 | −1.77 | −2.00 | 17% | 27% | 0% | <5 | 0.14 | Comparative |

[Evaluation Result of Example 2]

In the organic EL elements of each of Samples 205 to 216 including the transparent conductor in which the admittance-adjusting layer, and the conductive layer constituted of the platinum group element-containing layer and the metal material layer were formed in this order, excellent results were obtained in the driving voltage and the color change.

The organic EL elements of Samples 201 to 204 were not emitted except for Sample 202 in which the conductive layer was formed at a thickness of 12 nm. Furthermore, in Sample 202, the measurement result of the color change was low, and thus sufficient result was not obtained.

Samples 208 to 214 in which the metal material layer was formed at a thickness of 8 nm or more had better results of low driving voltage and small color change, than Samples 205 to 207 in which the metal material layer was formed at a thickness of 6 nm.

Furthermore, from the measurement results of the color change, Sample 206, Sample 207, Sample 209 and Sample 210 in which $TiO_2$ and $Nb_2O_5$ were used as the admittance-adjusting layer had better results than Sample 205 and Sample 208 in which ITO was used as the admittance-adjusting layer. From this result, it is considered that it is preferable to use $TiO_2$ and $Nb_2O_5$ as the admittance-adjusting layer.

Moreover, in each of Sample 213 and Sample 214 in which two admittance-adjusting layers are provided, more excellent results were obtained in the color change than each of Sample 209 and Sample 210 in which the conductive layer having the same thickness was provided. Namely, it is becomes possible to adjust the optical admittance of the conductive layer and to improve the optical properties of the organic EL element, by forming a plurality of the admittance-adjusting layers as in Sample 213 and Sample 214.

The present invention is not limited to the configurations explained in the above exemplary embodiments, and other various modification and change are possible within the scope not departing from other configurations of the present invention.

REFERENCE SIGNS LIST 10, 20, 32 Transparent conductor
11, 31 Substrate
12 Admittance-adjusting layer
13 Platinum group element-containing layer
14 Metal material layer
15 Conductive layer
16 Light-emitting functional layer
16a Positive hole injection layer
16b Positive hole transport layer
16c, 34 Light-emitting layer
16d Electron transport layer
16e Electron injection layer
17, 37 Counter electrode
21 First admittance-adjusting layer
22 Second admittance-adjusting layer
30 Organic electroluminescent element
33 Positive hole transport-injection layer
35 Positive hole blocking layer
36 Electron transport-injection layer

The invention claimed is:

1. An electronic device comprising:
   a transponder conductor which serves as an electrode and comprises:
   an admittance-adjusting layer, a platinum group element-containing layer, and a metal material layer which are laminated in this order on a substrate; and a light-emitting functional layer which is formed on the transparent conductor and contacts the metal material layer such that a plasmon absorption of the metal material layer is decreased, wherein:

the platinum group element-containing layer is in contact with the admittance-adjusting layer and the metal material layer, the platinum group element-containing layer has a thickness of 3 nm or less, the metal material layer is formed of silver or an alloy containing silver (Ag) as a main component and has a thickness of 15 nm or less, when an optical admittance at an interface on a side of the admittance-adjusting layer of the platinum group element-containing layer at a wavelength of 570 nm is expressed as $Y_1 = x_1 + iy_1$ and an optical admittance at an interface on a side opposite to the admittance-adjusting layer of the metal material layer at a wavelength of 570 nm is expressed as $Y_2 = x_2 + iy_2$ at least one of $x_1$ and $x_2$ is 1.6 or more, a plasmon absorption coefficient of the laminated platinum group element-containing layer and metal material layer is 15% or less in a whole wavelength range of 400 nm to 800 nm, and the light-emitting functional layer has a light-emitting layer constituted using at least an organic material.

* * * * *